(12) United States Patent
Cheng et al.

(10) Patent No.: US 12,218,013 B2
(45) Date of Patent: *Feb. 4, 2025

(54) GATE STRUCTURES FOR SEMICONDUCTOR DEVICES

(71) Applicant: Taiwan Semiconductor Manufacturing Co., Ltd., Hsinchu (TW)

(72) Inventors: Chun-Fai Cheng, Tin Shui Wai (HK); Chang-Miao Liu, Hsinchu (TW); Kuan-Chung Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/388,419

(22) Filed: Nov. 9, 2023

(65) Prior Publication Data

US 2024/0071835 A1  Feb. 29, 2024

Related U.S. Application Data

(63) Continuation of application No. 17/461,487, filed on Aug. 30, 2021, now Pat. No. 11,854,906, which is a (Continued)

(51) Int. Cl.
*H01L 21/8238* (2006.01)
*H01L 21/02* (2006.01)
(Continued)

(52) U.S. Cl.
CPC ........... *H01L 21/823857* (2013.01); *H01L 21/02192* (2013.01); *H01L 21/02603* (2013.01);
(Continued)

(58) Field of Classification Search
CPC ....... H01L 21/823857; H01L 21/02192; H01L 21/02603; H01L 21/28088;
(Continued)

(56) References Cited

U.S. PATENT DOCUMENTS 9,093,530 B2  7/2015  Huang et al.
9,171,929 B2  10/2015  Lee et al.
(Continued)

FOREIGN PATENT DOCUMENTS

CN  1933180 A  3/2007

OTHER PUBLICATIONS

First notice of examination directed to International Patent Application No. 202110346922.8, mailed Sep. 30, 2024; 8 pages.

*Primary Examiner* — Tong-Ho Kim
(74) *Attorney, Agent, or Firm* — Sterne, Kessler, Goldstein & Fox P.L.L.C.

(57) ABSTRACT

A semiconductor device with different gate structure configurations and a method of fabricating the semiconductor device are disclosed. The method includes depositing a high-K dielectric layer surrounding nanostructured channel regions, performing a first doping with a rare-earth metal (REM)-based dopant on first and second portions of the high-K dielectric layer, and performing a second doping with the REM-based dopants on the first portions of the high-K dielectric layer and third portions of the high-K dielectric layer. The first doping dopes the first and second portions of the high-K dielectric layer with a first REM-based dopant concentration. The second doping dopes the first and third portions of the high-K dielectric layer with a second REM-based dopant concentration different from the first REM-based dopant concentration. The method further includes depositing a work function metal layer on the (Continued)

high-K dielectric layer and depositing a metal fill layer on the work function metal layer

20 Claims, 28 Drawing Sheets

Related U.S. Application Data continuation of application No. 16/835,987, filed on Mar. 31, 2020, now Pat. No. 11,107,736.

(51) Int. Cl.
| | | |
|---|---|---|
| *H01L 21/28* | (2006.01) | |
| *H01L 21/311* | (2006.01) | |
| *H01L 21/3115* | (2006.01) | |
| *H01L 27/092* | (2006.01) | |
| *H01L 29/06* | (2006.01) | |
| *H01L 29/423* | (2006.01) | |
| *H01L 29/49* | (2006.01) | |
| *H01L 29/51* | (2006.01) | |
| *H01L 29/66* | (2006.01) | |
| *H01L 29/786* | (2006.01) | |

(52) U.S. Cl.
CPC .. *H01L 21/28088* (2013.01); *H01L 21/28185* (2013.01); *H01L 21/31111* (2013.01); *H01L 21/3115* (2013.01); *H01L 21/823807* (2013.01); *H01L 21/823842* (2013.01); *H01L 27/092* (2013.01); *H01L 29/0673* (2013.01); *H01L 29/42392* (2013.01); *H01L 29/4908* (2013.01); *H01L 29/4966* (2013.01); *H01L 29/517* (2013.01); *H01L 29/66742* (2013.01); *H01L 29/78696* (2013.01)

(58) Field of Classification Search
CPC ......... H01L 21/28185; H01L 21/31111; H01L 21/3115; H01L 21/823807; H01L 21/823842; H01L 27/092; H01L 29/0673; H01L 29/42392; H01L 29/4908; H01L 29/4966; H01L 29/517; H01L 29/66742; H01L 29/78696; H01L 29/513; H01L 21/823462; H01L 27/088; H01L 29/0665; H01L 27/0924; H01L 29/401; H01L 29/42364; H01L 29/495; H01L 29/78
USPC ....................................................... 257/351
See application file for complete search history.

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,997,519 B1 | 6/2018 | Bao et al. |
| 10,825,736 B1 | 11/2020 | Zhang et al. |
| 11,107,736 B1 * | 8/2021 | Cheng ............. H01L 21/823807 |
| 11,854,906 B2 * | 12/2023 | Cheng ............... H01L 21/28185 |
| 2018/0226300 A1 | 8/2018 | Song et al. |
| 2019/0148237 A1 | 5/2019 | Wang |
| 2019/0198614 A1 | 6/2019 | Reboh et al. |
| 2019/0304846 A1 | 10/2019 | Lee et al. |
| 2019/0318967 A1 | 10/2019 | Chen et al. |
| 2020/0373300 A1 * | 11/2020 | Zhang ............... H01L 21/28158 |
| 2021/0391225 A1 | 12/2021 | Cheng et al. |

* cited by examiner

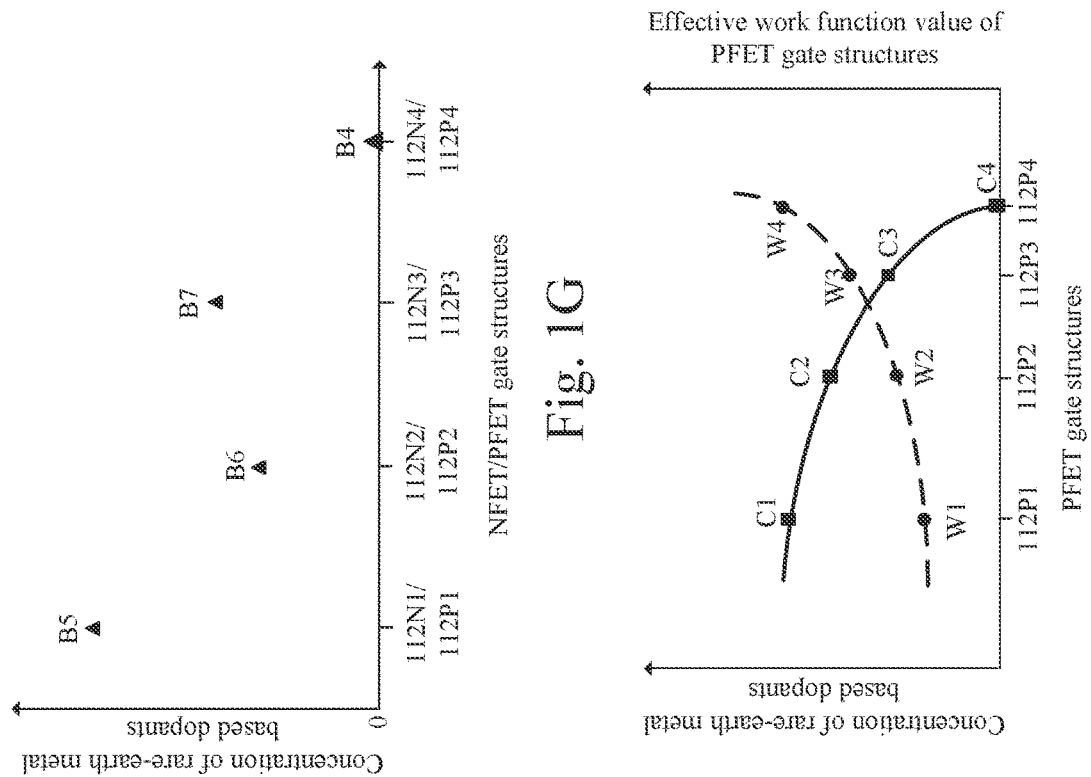
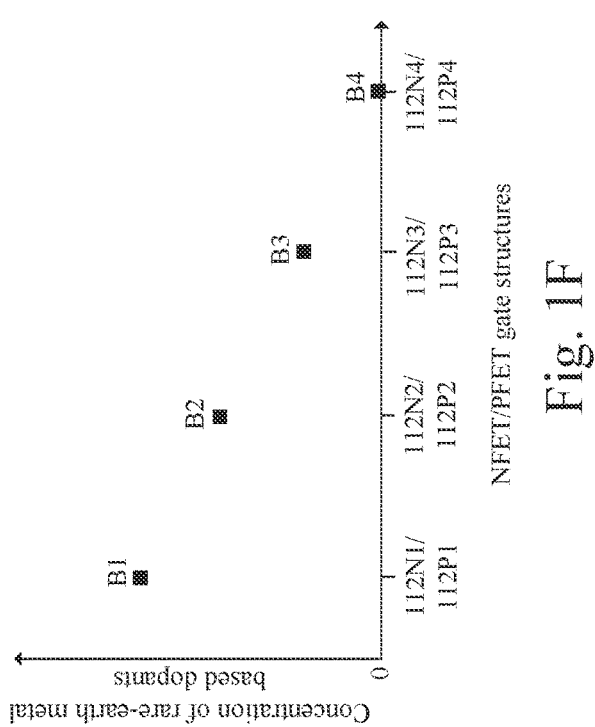
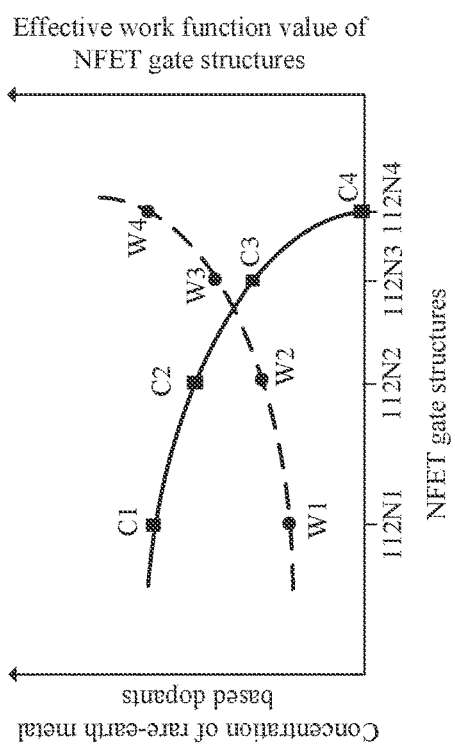

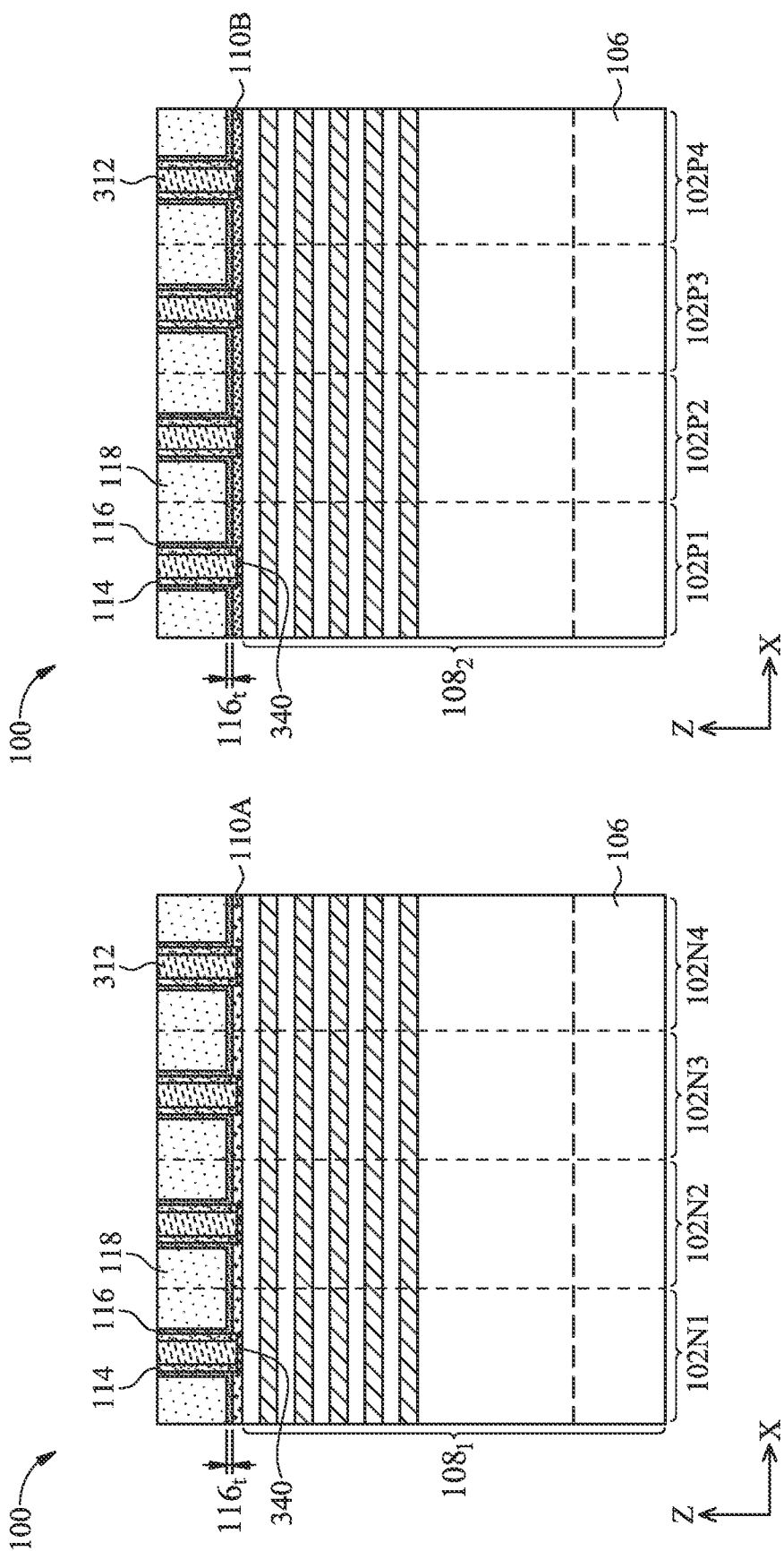

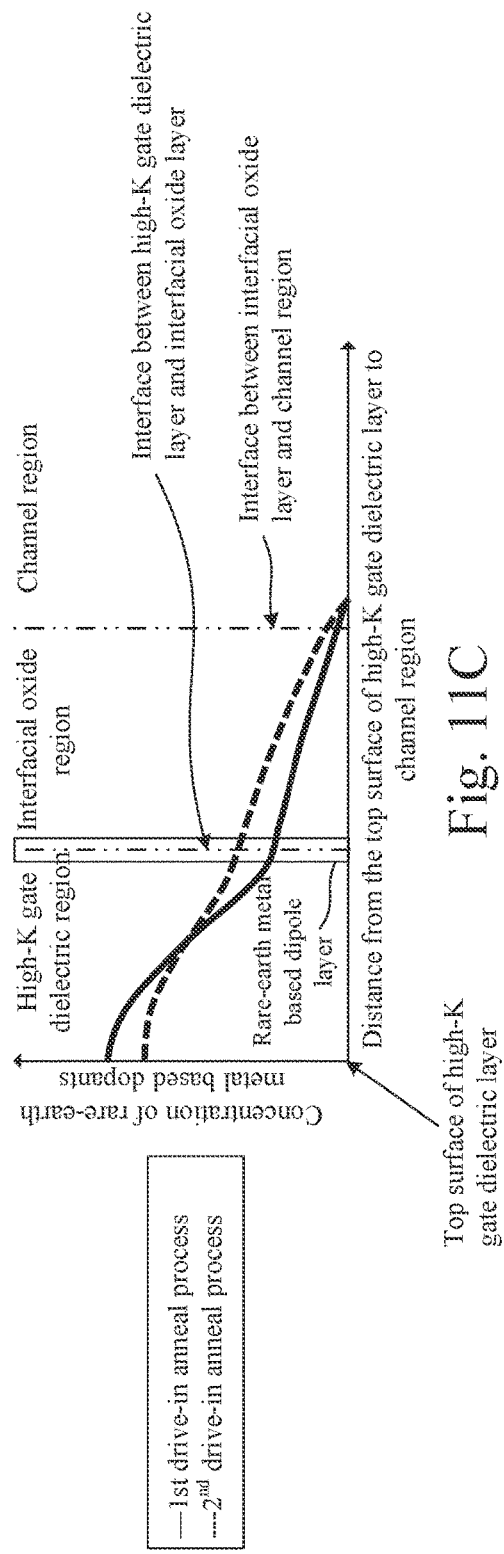
Fig. 11C
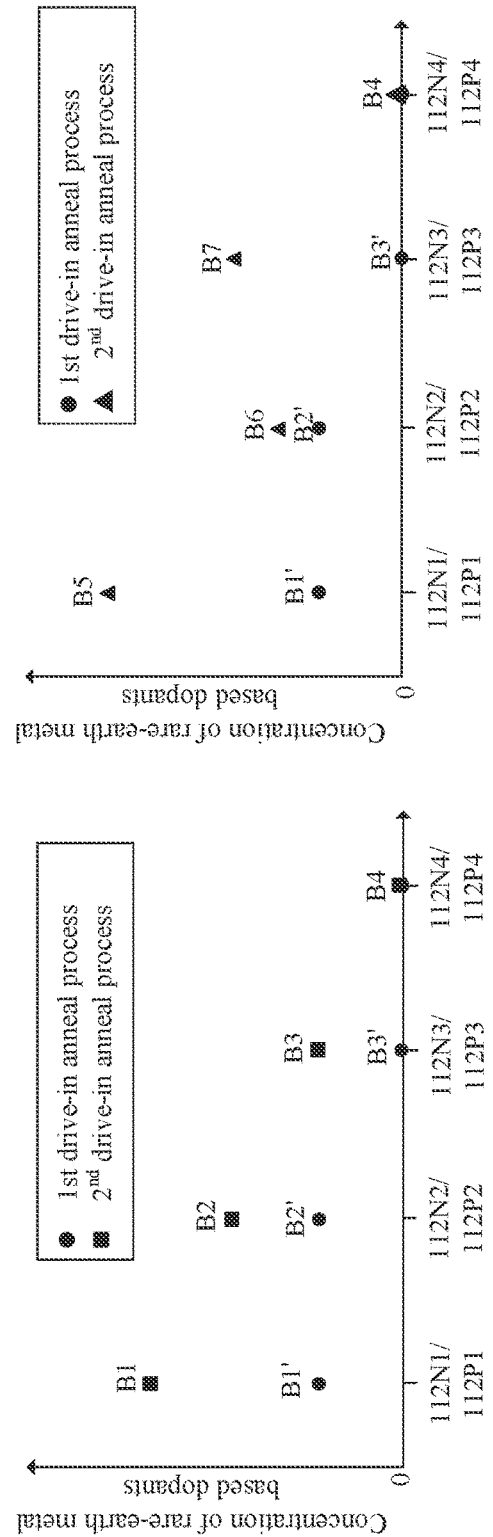
Fig. 11D
Fig. 11E

GATE STRUCTURES FOR SEMICONDUCTOR DEVICES

CROSS-REFERENCE TO RELATED APPLICATIONS

This application is a continuation of U.S. patent application Ser. No. 17/461,487, titled "Gate Structures for Semiconductor Devices," filed Aug. 30, 2021, which is a continuation of U.S. patent application Ser. No. 16/835,987, titled "Gate Structures for Semiconductor Devices," filed Mar. 31, 2020, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 3A-12A and 3B-12B illustrate cross-sectional views of a semiconductor device with different gate structures at various stages of its fabrication process, in accordance with some embodiments.

FIGS. 8C-8D and 11C-11E illustrate device characteristics of a semiconductor device with different gate structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
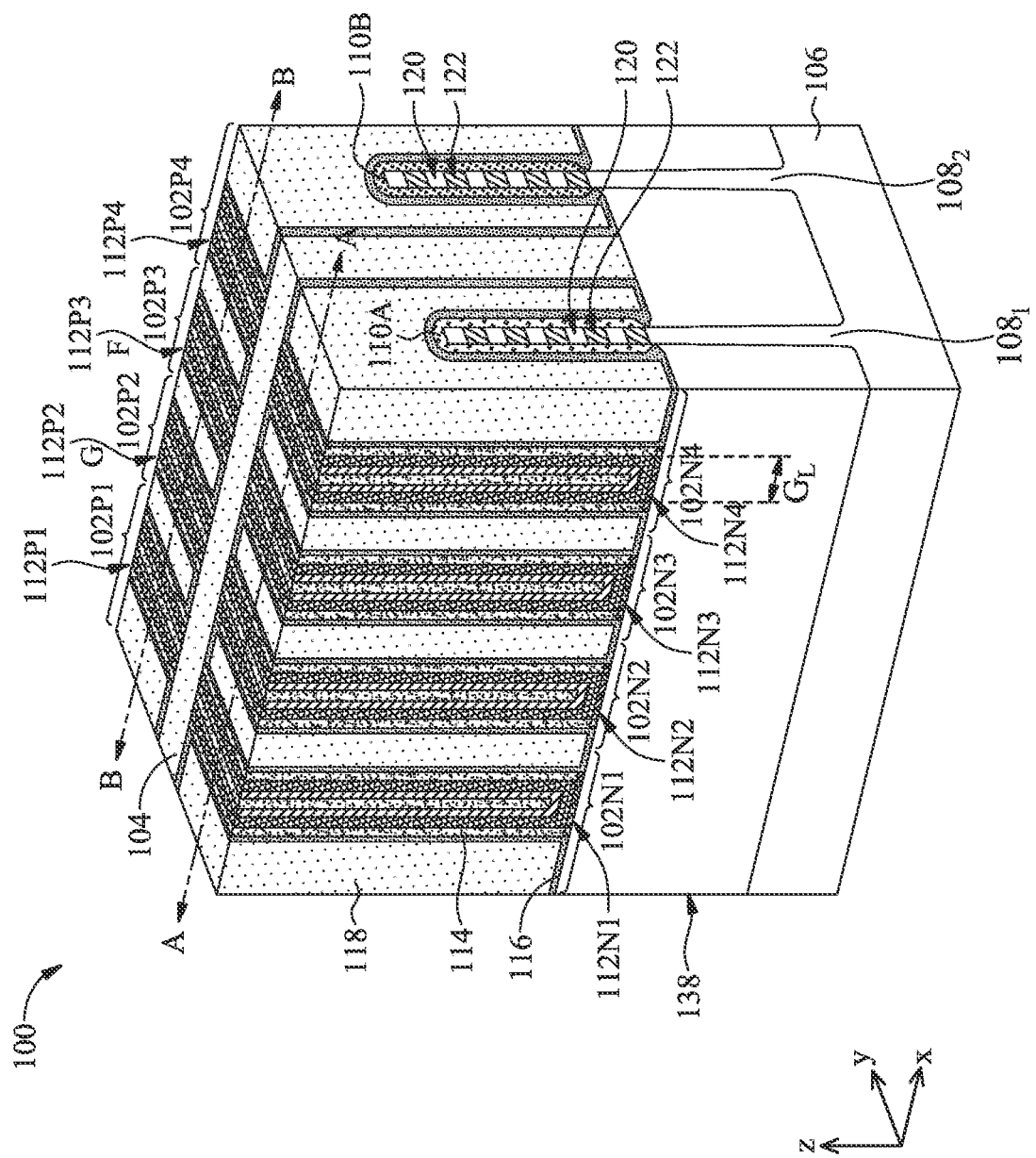
FIGS. 1A, 1B-1C, and 1D-1Q illustrate an isometric view, cross-sectional views, and device characteristics, respectively, of a semiconductor device with different gate structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "nanostructured" defines a structure, layer, and/or region as having a horizontal dimension (e.g., along an X- and/or Y-axis) and/or a vertical dimension (e.g., along a Z-axis) less than, for example, 100 nm.

As used herein, the term "n-type work function metal (nWFM)" defines a metal or a metal-containing material with a work function value closer to a conduction band energy than a valence band energy of a material of a FET channel region. In some embodiments, the term "n-type work function metal (nWFM)" defines a metal or a metal-containing material with a work function value less than 4.5 eV.

As used herein, the term "p-type work function metal (pWFM)" defines a metal or a metal-containing material with a work function value closer to a valence band energy than a conduction band energy of a material of a FET channel region. In some embodiments, the term "p-type work function metal (pWFM)" defines a metal or a metal-containing material with a work function value equal to or greater than 4.5 eV.

As used herein, the term "effective work function value" defines a difference between a work function value of a WFM layer of a FET gate structure and a potential difference induced across a dipole layer formed between a high-k dielectric layer and an interfacial layer of the FET gate structure.

In some embodiments, the terms "about" and "substantially" can indicate a value of a given quantity that varies within 5% of the value (e.g., ±1%, ±2%, ±3%, ±4%, ±5% of the value).

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage Vt—to turn on a field effect transistor (FET) can depend on the semiconductor material of the FET channel region and the work function value of a WFM layer of a gate structure of the FET. For example, for an n-type FET (NFET), reducing the difference between the work function value of the nWFM layer of the NFET gate structure and the conduction band energy of the material (e.g., 4.1 eV for Si or 3.8 eV for SiGe) of the NFET channel region can reduce the NFET threshold voltage. For a p-type FET (PFET), reducing the difference between the work function value of the pWFM layer of the PFET gate structure and the valence band energy of the material (e.g., 5.2 eV for Si or 4.8 eV for SiGe) of the PFET channel region can reduce the PFET threshold voltage. The threshold voltage of the FET gate structure can depend on the thickness and/or material composition of each of the layers of the FET gate structures. As such, FETs can be manufactured with different threshold voltages by adjusting the thickness and/or material composition of the gate structures.

Due to the increasing demand for low power portable devices, there is an increasing demand for FETs with low threshold voltages, such as threshold voltages lower than 100 mV. One way to achieve such low threshold voltage in FETs can be by using work function metal (WFM) layer(s) with thickness(es) greater than about 4 nm (e.g., about 5 nm to about 10 nm) in the gate structures. However, the thickness(es) of the WFM layer(s) in the gate structures can be constrained by the gate structure geometries of the FETs. For example, in gate-all-around (GAA) FETs, the thickness of the WFM layer(s) can be constrained by the spacing between the nanostructured channel regions of the GAA FETs. Also, depositing such thick WFM layer(s) can become increasingly challenging with the continuous scaling down of FETs (e.g., GAA FETs).

The present disclosure provides example structures of FETs (e.g., finFETs or GAA FETs) with gate structures of different effective work function values to provide different and/or low threshold voltages and example methods of forming such FETs on a same substrate. The example methods form FETs of different conductivity types with different effective work function values without increasing the thicknesses of the WFM layers. These example methods can be less complicated and more cost-effective in manufacturing reliable gate structures in FETs with nanostructured channel regions and with different and/or low threshold voltages than other methods of forming FETs with similar channel dimensions and threshold voltages on the same substrate. In addition, these example methods can form FET gate structures with smaller dimensions (e.g., thinner gate stacks) than other methods of forming FETs with similar threshold voltages.

In some embodiments, NFETs and PFETs with different gate structure configurations can be selectively formed on the same substrate. To achieve NFETs and PFETs with different and/or low threshold voltages, high-K (HK) gate dielectric layers of NFET and PFET gate structures can be doped with different concentrations of rare-earth metal (REM)-based dopants. The different concentrations of REM-based dopants can generate dipole layers with varying dipole concentrations in the NFET and PFET gate structures. Tuning the dipole concentrations can tune the effective work function values of the NFET and PFET gate structures and as a result, adjust the threshold voltages of the NFETs and PFETs. As such, NFETs and PFETs with different and/or low threshold voltages can be obtained without increasing the thickness of the WFM layers.

Figure 1B:
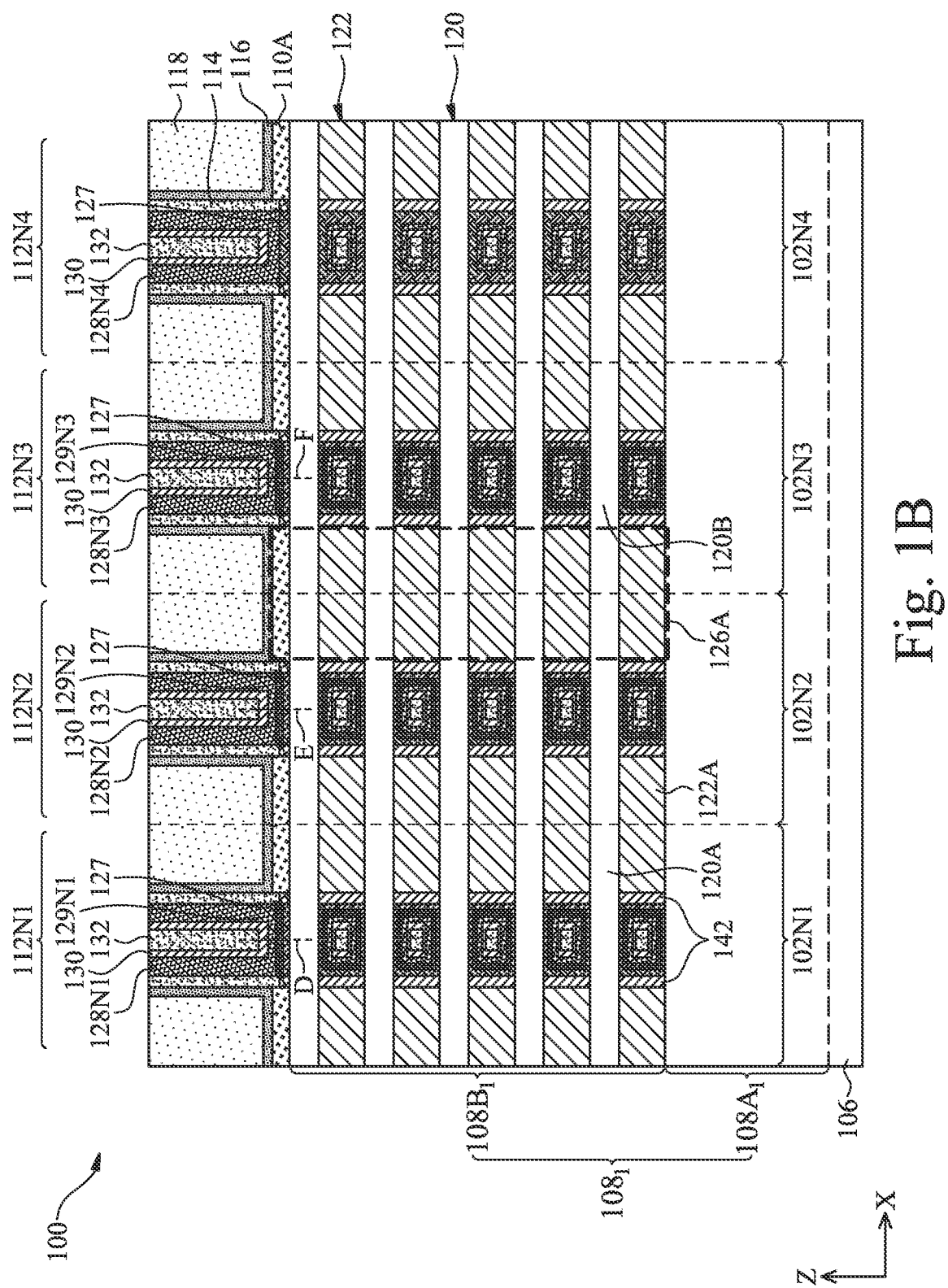
Figure 1C:
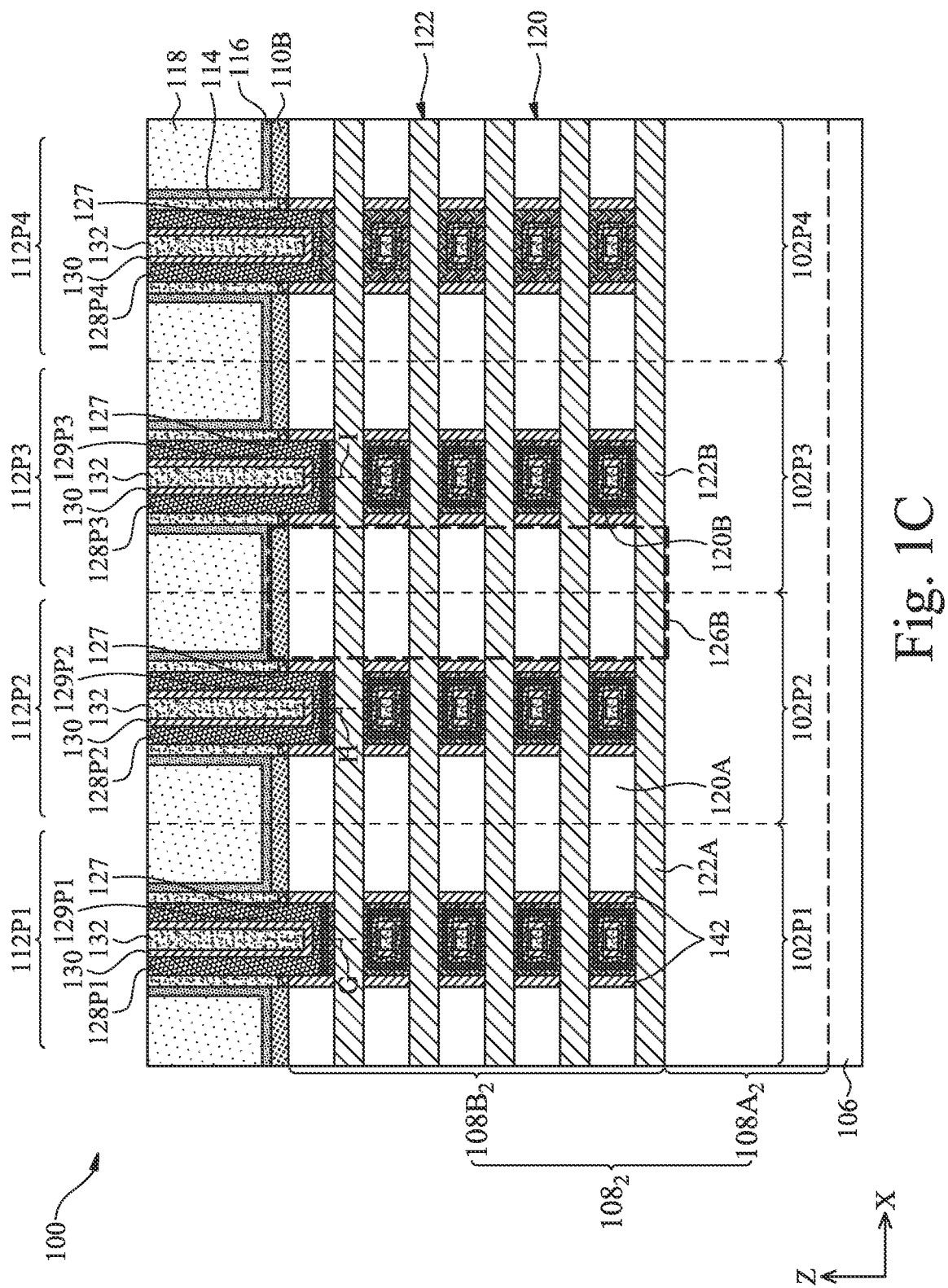
Figure 1D:
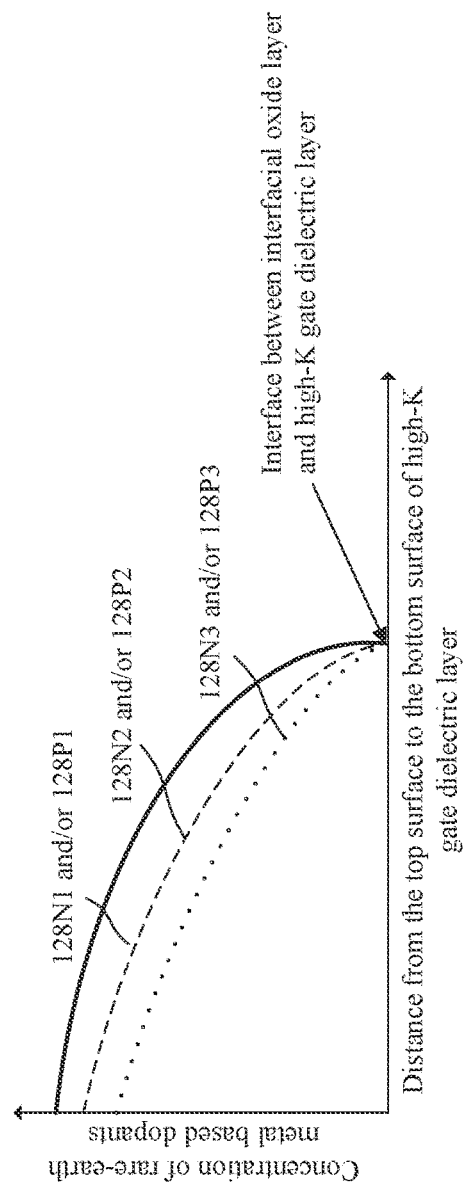

A semiconductor device 100 having NFETs 102N1-102N4 and PFETs 102P1-102P4 is described with reference to FIGS. 1A-1Q, according to some embodiments. FIG. 1A illustrates an isometric view of semiconductor device 100, according to some embodiments. FIGS. 1B-1C illustrate cross-sectional views along lines A-A and B-B of semiconductor device 100 of FIG. 1A, respectively, according to some embodiments. FIGS. 1D-1Q illustrate devices characteristics of semiconductor device 100, according to some embodiments. Even though eight FETs are discussed with reference to FIGS. 1A-1Q, semiconductor device 100 can have any number of FETs. The discussion of elements of NFETs 102N1-102N4 and PFETs 102P1-102P4 with the same annotations applies to each other, unless mentioned otherwise. The isometric view and cross-sectional views of semiconductor device 100 are shown for illustration purposes and may not be drawn to scale.

Referring to FIGS. 1A-1C, NFETs 102N1-102N4 and PFETs 102P1-102P4 can be formed on a substrate 106. Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

NFETs 102N1-102N4 and PFETs 102P1-102P4 can include fin structures $108_1$-$108_2$ extending along an X-axis, epitaxial fin regions 110A-110B, gate structures 112N1-112N4 and 112P1-112P4 (also referred to as "gate-all-around (GAA) structures 112N1-112N4 and 112P1-112P4"), respectively, inner spacers 142, and gate spacers 114.

As shown in FIGS. 1B-1C, fin structure $108_1$ can include a fin base portion $108A_1$ and a stacked fin portion $108B_1$ disposed on fin base portion $108A_1$ and fin structure $108_2$ can include a fin base portion $108A_2$ and a stacked fin portion $108B_2$ disposed on fin base portion $108A_2$. In some embodiments, fin base portions $108A_1$-$108A_2$ can include material similar to substrate 106. Fin base portions $108A_1$-$108A_2$ can be formed from photolithographic patterning and etching of substrate 106. Stacked fin portions $108B_1$-$108B_2$ can include first and second semiconductor layers 120 and 122 stacked in an alternating configuration. Each first semiconductor layer 120 of stacked fin portion $108B_1$ can have (i) nanostructured regions 120A (shown in FIG. 1B) underlying epitaxial fin regions 110A, and (ii) nanostructured channel regions 120B (shown in FIG. 1B) wrapped around by gate structures 112N1-112N4. Each second semiconductor layer 122 of stacked fin portion $108B_2$ can have (i) nanostructured regions 122A (shown in FIG. 1C) underlying epitaxial fin regions 110B, and (ii) nanostructured channel regions 122B (shown in FIG. 1C) wrapped around by gate structures 112P1-112P4.

First and second semiconductor layers 120 and 122 can include semiconductor materials different from each other. In some embodiments, first and second semiconductor layers 120 and 122 can include semiconductor materials with oxidation rates and/or etch selectivity different from each other. In some embodiments, first and second semiconductor layers 120 and 122 can include semiconductor materials similar to or different from substrate 106. First and second semiconductor layers 120 and 122 can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof.

In some embodiments, first semiconductor layers 120 can include Si, SiAs, silicon phosphide (SiP), SiC, or silicon carbon phosphide (SiCP) for NFETs 102N1-102N4 and second semiconductor layers 122 can include SiGe, silicon germanium boron (SiGeB), germanium boron (GeB), silicon germanium stannum boron (SiGeSnB), or a III-V semiconductor compound for PFETs 102P1-102P4. In some embodiments, first and semiconductor layers 120 and 122 can each include Si, SiAs, SiP, SiC, or SiCP for NFETs 102N1-102N4 or SiGe, SiGeB, GeB, SiGeSnB or a III-V semiconductor compound for PFETs 102P1-102P4. In some embodiments, first and second semiconductor layers 120 and 122 can include materials similar to each other for NFETs 102N1-102N4 and PFETs 102P1-102P4. Though rectangular cross-sections of nanostructured channel regions 120B and 122B are shown in FIG. 1B, nanostructured channel regions 120B and 122B can have cross-sections of other geometric shapes (e.g., circular, elliptical, triangular, or polygonal).

Referring to FIGS. 1A-1C, epitaxial fin regions 110A can be grown wrapped around stacked fin portion $108B_1$. Similarly, epitaxial fin regions 110B can be grown wrapped around stacked fin portion $108B_2$. In some embodiments, epitaxial fin regions 110A-110B can be grown on fin base portions $108A_1$-$108A_2$, instead of being wrapped around stacked fin portion $108B_1$-$108B_2$, respectively. Epitaxial fin regions 110A-110B along with their underlying nanostructured regions 120A and 122A can form source/drain (S/D) regions 126A-126B, respectively.

Epitaxial fin regions 110A-110B can include epitaxially-grown semiconductor materials similar to or different from each other. In some embodiments, the epitaxially-grown semiconductor material can include the same material or a different material from the material of substrate 106. Epitaxial fin regions 110A-110B can be n- and p-type, respectively. In some embodiments, n-type epitaxial fin regions 110A can have materials with SiAs, SiC, or SiCP. P-type epitaxial fin regions 110B can include SiGe, SiGeB, GeB, SiGeSnB, a III-V semiconductor compound, or a combination thereof.

Gate structures 112N1-112N4 and 112P1-112P4 can be multi-layered structures and can be wrapped around nanostructured channel regions 120B and 122n, respectively, for which gate structures 112N1-112N4 and 112P1-112P4 can be referred to as "gate-all-around (GAA) structures" or "horizontal gate-all-around (HGAA) structures," and NFETs 102N1-102N4 and PFETs 102P1-102P4 can be referred to as "GAA FETs 102N1-102N4 and 102P1-102P4" or "GAA NFETs 102N1-102N4 and PFETs 102P1-102P4," respectively.

Referring to FIGS. 1A-1C, gate structures 112N1-112N4 and 112P1-112P4 can include interfacial oxide layers 127, high-k (HK) gate dielectric layers 128N1-128N4 and 128P1-128P4, gate WFM layers 130, and gate metal fill layers 132. Even though FIGS. 1B-1C show that all the layers of gate structures 112N1-112N4 and 112P1-112P4 are wrapped around nanostructured channel regions 120B and 122B, respectively, nanostructured channel regions 120B and 122B can be wrapped around by at least interfacial oxide layers 127 and HK gate dielectric layers 128N1-128N4 and 128P1-128P4 to fill the spaces between adjacent nanostructured channel regions 120B and 122B. As such, nanostructured channel regions 120B and 122B can be electrically isolated from each other, respectively, to prevent shorting between gate structures 112N1-112N4 and 112P1-112P4 and S/D regions 126A-126B during operation of NFETs 102N1-102N4 and PFETs 102P1-102P4, respectively. In some embodiments, instead of all the layers of gate structures 112N1-112N4 and 112P1-112P4 being wrapped around nanostructured channel regions 120B and 122B, respectively, nanostructured channel regions 120B and 122B can be wrapped around by at least interfacial oxide layers 127, HK gate dielectric layers 128N1-128N4 and 128P1-128P4, and gate WFM layers 130 to fill the spaces between adjacent nanostructured channel regions 120B and 122B.

Interfacial oxide layers 127 can be disposed on nanostructured channel regions 120B and 122B and can include silicon oxide and a thickness ranging from about 0.5 nm to about 1.5 nm. Each of HK gate dielectric layers 128N1-128N4 and 128P1-128P4 can have a thickness (e.g., about 1 nm to about 3 nm) that is about 2 to 3 times the thickness of interfacial oxide layers 127 and can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iii) a combination thereof.

In some embodiments, HK gate dielectric layers 128N1-128N3 and 128P1-128P3 can include rare-earth metal (REM)-based dopants. The REM-based dopants can include oxides of REM, such as Lanthanum oxide ($La_2O_3$), Yttrium oxide ($Y_2O_3$), Cerium oxide ($CeO_2$), Ytterbium oxide ($Yb_2O_3$), Erbium oxide ($Er_2O_3$), or a combination thereof. The REM-based dopant concentration in HK gate dielectric layers 128N1-128N3 and 128P1-128P3 can be similar or different from each other. In some embodiments, HK gate dielectric layers 128N1 and 128P1 can have REM-based dopant concentration C1, HK gate dielectric layers 128N2 and 128P2 can have REM-based dopant concentration C2, and HK gate dielectric layers 128N3 and 128P3 can have REM-based dopant concentration C3. In some embodiments, concentration C1 is greater than concentrations C2 and/or C3. In some embodiments, concentration C1 is greater than concentrations C2 and C3, and concentration C2 is greater than concentration C3. In some embodiments, concentration C1 is greater than concentrations C2 and C3, and concentration C3 is greater than concentration C2. In some embodiments, HK gate dielectric layers 128N4 and 128P4 can have REM-based dopant concentration C4, which can be equal to zero. In some embodiments, REM-based dopant concentrations C1-C3 can range from about 0.1 atomic percent to about 15% atomic percent.

The doping profiles of REM-based dopants in HK gate dielectric layers 128N1-128N3 and 128P1-128P3 along a vertical axis (e.g., a Z-axis) through HK gate dielectric layers 128N1-128N3 and 128P1-128P3 are illustrated in FIG. 1D, according to some embodiments. As shown in FIG. 1D, the REM-based dopants can have a lower concentration in the regions of HK gate dielectric layers 128N1-128N3 and 128P1-128P3 closer to interfacial oxide layers 127 than the regions of HK gate dielectric layers 128N1-128N3 and 128P1-128P3 closer to WFM layers 130.

Figure 1E:
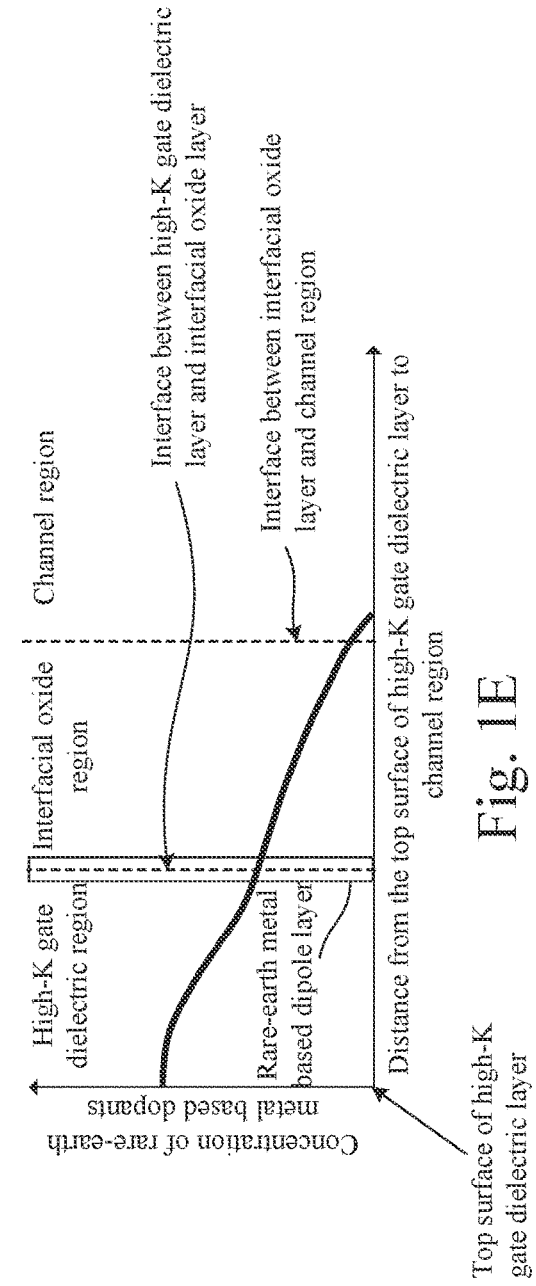

Referring to FIG. 1E, the REM-based dopants in HK gate dielectric layers 128N1-128N3, REM-based dipole layers 129N1-129N3, interfacial oxide layers 127, and nanostructured channel regions 120B of NFETs 102N1-102N3 can have graded doping profiles along lines D, E, and/or F shown in FIG. 1B, according to some embodiments. As shown in FIG. 1E, the concentration of REM-based dopants can gradually decrease from the top surfaces of HK gate dielectric layers 128N1-128N3 towards nanostructured channel regions 120B. In some embodiments, the REM-based dopants in HK gate dielectric layers 128P1-128P3, REM-based dipole layers 129P1-129P3, interfacial oxide layers 127, and nanostructured channel regions 122B of PFETs 102P1-102P3 can have graded doping profiles along lines G, H, and/or I (shown in FIG. 1C) similar to the graded doping profile of FIG. 1E.

Referring to FIG. 1F, in some embodiments, the interfaces between HK gate dielectric layers 128N1-128N4 and interfacial layers 127 of NFET gate structures 112N1-112N4 can have REM-based dopant concentrations B1-B4, respectively, where concentration B1 is greater than concentration B2, which is greater than concentration B3. Concentration B4 can be equal to zero. In some embodiments, REM-based dopant concentrations B1-B3 can range from about 0.1 atomic percent to about 15% atomic percent. In some embodiments, concentration B1 can be a sum of concentrations B2-B3 based on a method of fabricating NFETs 102N1-102N3 described with reference to FIGS. 3A-12A, 8C-8D, and 11C-11D. In some embodiments, instead of concentrations B1-B3, the interfaces between HK gate dielectric layers 128N1-128N3 and interfacial layers 127 can have REM-based dopant concentrations B5-B7 as shown in FIG. 1G, where concentration B5 is greater than concentration B7, which is greater than concentration B6. Concentration B5 can be a sum of concentrations B6-B7 based on a method of fabricating NFETs 102N1-102N3 described with reference to FIGS. 3A-12A, 8C-8D, 11C, and 11E. Further referring to FIGS. 1F-1G, the discussion of REM-based dopant concentrations B1-B4 and B5-B7 can apply to REM-based dopant concentrations in the interfaces between HK gate dielectric layers 128P1-128P4 and interfacial layers 127 of PFET gate structures 112P1-112P4, according to some embodiments.

In some embodiments, the REM-based dopants can be used to tune effective work function values W1-W4 of gate structures 112N1-112N4 and 112P1-112P4, and as a result adjust threshold voltages TN1-TN4 and TP1-TP4 of gate structures 112N1-112N4 and 112P1-112P4, respectively. In some embodiments, the term "effective work function value" defines a difference between a work function value of a WFM layer (e.g., WFM layer 130) of a FET gate structure (e.g., gate structures 112N1-112N4 and 112P1-112P4) and a potential difference induced across a dipole layer (e.g., dipole layers 129N1-129N3 and 129P1-129P3) formed between a high-k dielectric layer (e.g., HK gate dielectric layers 128N1-128N3 and 128P1-128P3) and an interfacial layer (e.g., interfacial oxide layers 127) of the FET gate structure. In some embodiments, gate structures 112N1 and 112P1 can have effective work function values W1, gate structures 112N2 and 112P2 can have effective work function values W2, gate structures 112N3 and 112P3 can have effective work function values W3, and gate structures 112N4 and 112P4 can have effective work function values W4. As shown in FIGS. 1H-1I, the REM-based dopant concentrations of HK gate dielectric layers 128N1-128N4 and 128P1-128P4 can be inversely proportional to the respective effective work function values of gate structures 112N1-112N4 and 112P1-112P4.

Due to the REM-based dopants in HK gate dielectric layers 128N1-128N3 and 128P1-128P3, REM-based dipole layers 129N1-129N3 and 129P1-129P3 can be formed at the interfaces between interfacial oxide layers 127 and HK gate dielectric layers 128N1-128N3 and 128P1-128P3 as shown in FIGS. 1B-1C. In some embodiments, dipole layers 129N1-129N3 and 129P1-129P3 can include dipoles between REM ions and oxygen ions. In some embodiments, dipole layers 129N1 and 129P1 can have REM-based dipole concentration D1, dipole layers 129N2 and 129P2 can have REM-based dipole concentration D2, and dipole layers 129N3 and 129P3 can have REM-based dipole concentration D3. As HK gate dielectric layers 128N4 and 128P4 does not have REM-based dopants, REM-based dipole concentration D4 at the interfaces between interfacial oxide layers 127 and HK gate dielectric layers 128N4 and 128P4 can be equal to zero.

Figure 1J:
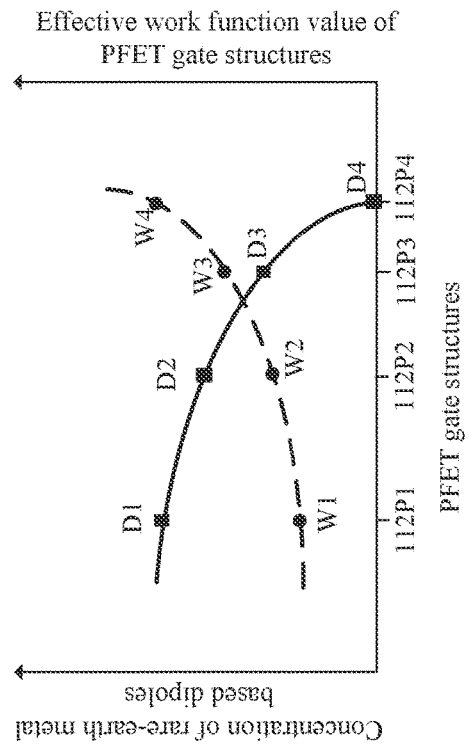
Figure 1K:
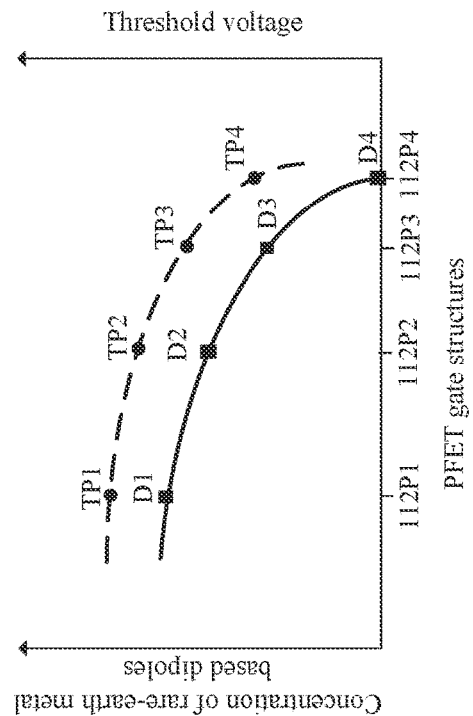
Figure 1L:
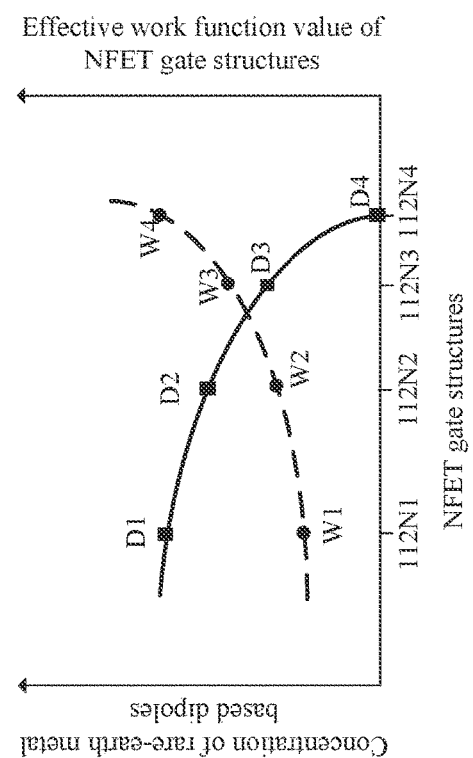
Figure 1M:
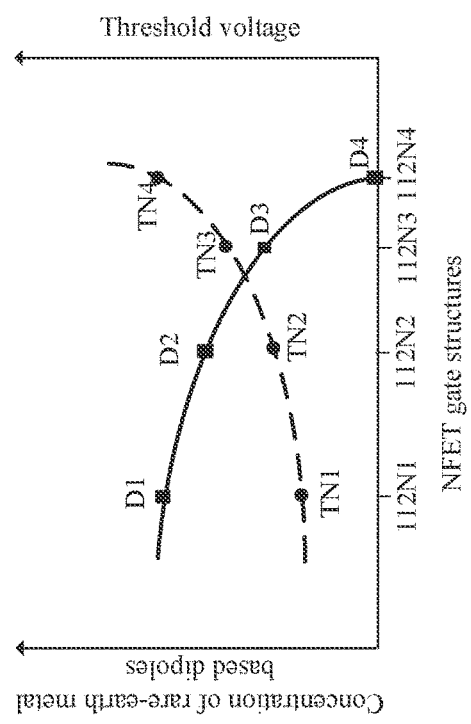

The REM-based dipole concentrations can be directly proportional to the REM-based dopant concentrations, and as a result the REM-based dipole concentration profiles shown in FIGS. 1J-1M can be similar to the REM-based dopant concentration profiles shown in FIGS. 1H-1I. Referring to FIGS. 1J-1K, similar to the REM-based dopant concentrations, the REM-based dipole concentrations of dipole layers 129N1-129N4 and 129P1-129P4 can be inversely proportional to the respective effective work function values W1-W4 of gate structures 112N1-112N4 and 112P1-112P4. Referring to FIGS. 1L-1M, the REM-based dipole concentrations of dipole layers 129N1-129N4 can be inversely proportional to the respective threshold voltages of gate structures 112N1-112N4 and the REM-based dipole concentrations of dipole layers 129P1-129P4 can be directly proportional to the respective threshold voltages of gate structures 112P1-112P4. Thus, NFETs 102N1-102N4 and PFETs 102P1-102P4 can have gate structures with different and/or low threshold voltages with different REM-based dopant concentrations C1-C4 in HK gate dielectric layers 128N1-128N4 and 128P1-128P4 with same gate WFM layers 130.

Figure 1O:
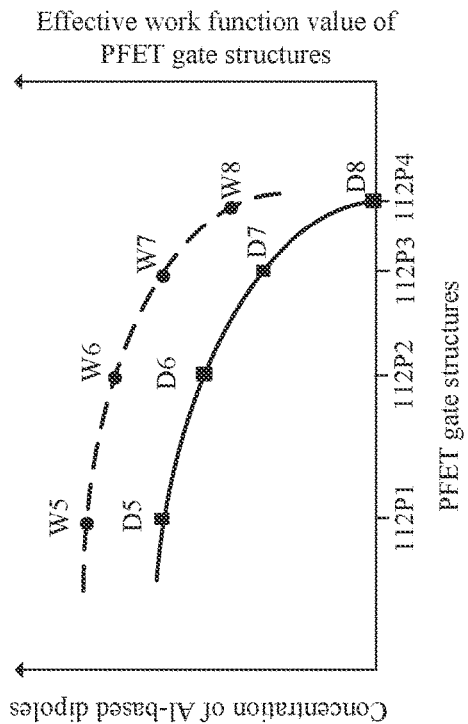
Figure 1Q:
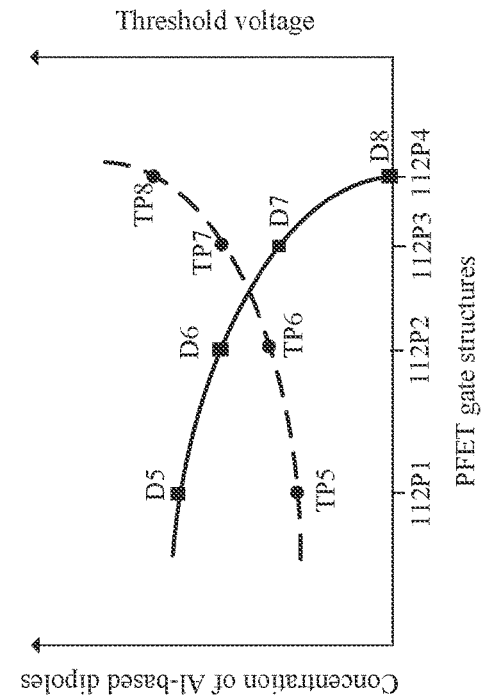
Figure 1N:
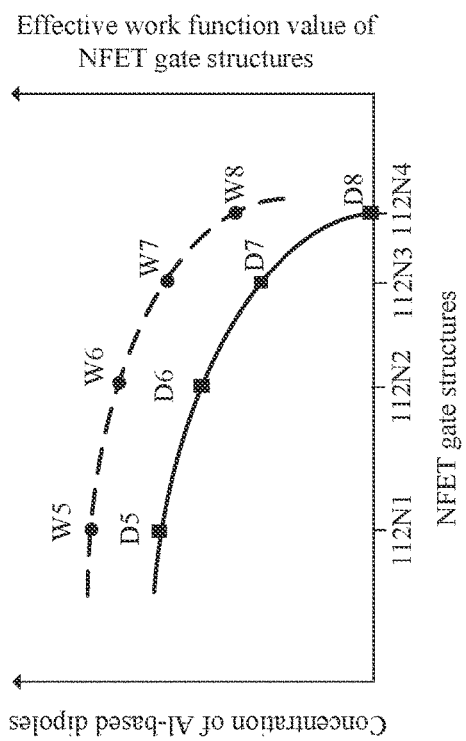

In some embodiments, instead of REM-based dopants, HK gate dielectric layers 128N1-128N3 and 128P1-128P3 can have Al-based dopants. The Al-based dopants can include oxides of Al ($Al_xO_y$), such as $Al_2O_3$. The doping profiles and concentrations of Al-based dopants in HK gate dielectric layers 128N1-128N3 and 128P1-128P3 can be similar to the doping profiles and concentrations of REM-based dopants shown in FIGS. 1H-1I. Similar to the REM-based dopants, the Al-based dopants can be used to tune effective work function values of gate structures 112N1-112N4 and 112P1-112P4, and as a result adjust threshold voltages of gate structures 112N1-112N4 and 112P1-112P4. As shown in FIGS. 1N-1O, in some embodiments, gate structures 112N1 and 112P1 with respective HK gate dielectric layers 128N1 and 128P1 doped with the Al-based dopants can have effective work function values W5, gate structures 112N2 and 112P2 with HK gate dielectric layers 128N2 and 128P2 doped with the Al-based dopants can have effective work function values W6, gate structures 112N3 and 112P3 with HK gate dielectric layers 128N3 and 128P3 doped with the Al-based dopants can have effective work function values W7, and gate structures 112N4 and 112P4 with HK gate dielectric layers 128N4 and 128P4 doped with the Al-based dopants can have effective work function values W8. The Al-based dopant concentrations of HK gate dielectric layers 128N1-128N4 and 128P1-128P4 can be directly proportional to the respective effective work function values of gate structures 112N1-112N4 and 112P1-112P4.

Similar to the REM-based dopants, the Al-based dopants can form Al-based dipole layers 129N1-129N3 and 129P1-129P3 as shown in FIGS. 1B-1C. In some embodiments, dipole layers 129N1-129N3 and 129P1-129P3 can include dipoles between Al ions and oxygen ions. As shown in FIGS. 1N-1Q, in some embodiments, dipole layers 129N1 and 129P1 can have Al-based dipole concentration D1, dipole layers 129N2 and 129P2 can have Al-based dipole concentration D2, and dipole layers 129N3 and 129P3 can have Al-based dipole concentration D3. As HK gate dielectric layers 128N4 and 128P4 does not have Al-based dopants, Al-based dipole concentration D4 at the interfaces between interfacial oxide layers 127 and HK gate dielectric layers 128N4 and 128P4 can be equal to zero.

Figure 1P:
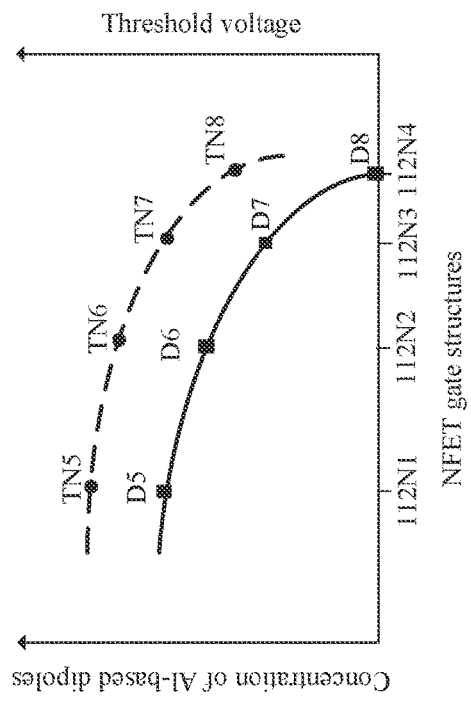

Referring to FIGS. 1N-1O, the Al-based dipole concentrations of dipole layers 129N1-129N4 and 129P1-129P4 can be directly proportional to the respective effective work function values W5-W8 of gate structures 112N1-112N4 and 112P1-112P4. Referring to FIGS. 1P-1Q, the Al-based dipole concentrations of dipole layers 129N1-129N4 can be directly proportional to the respective threshold voltages TN5-TN8 of gate structures 112N1-112N4 and the Al-based dipole concentrations of dipole layers 129P1-129P4 can be inversely proportional to the respective threshold voltages of gate structures 112P1-112P4. Thus, NFETs 102N1-102N4 and PFETs 102P1-102P4 can have gate structures with different and/or low threshold voltages with different Al-based dopant concentrations in HK gate dielectric layers 128N1-128N4 and 128P1-128P4 with same gate WFM layers 130.

Referring to FIGS. 1B-1C, in some embodiments, gate WFM layers 130 can be disposed on and in physical contact with HK gate dielectric layers 128N1-128N4 and 128P1-128P4 and can include nWFM and/or pWFM layers. In some embodiments, the nWFM layers can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or a combination thereof. In some embodiments, each of the nWFM layers can include a thickness ranging from about 1 nm to about 3 nm. The thickness within this range can allow the nWFM layers to be wrapped around nanostructured channel regions 120B and 122B for low threshold voltage without being constrained by the spacing between adjacent nanostructured channel regions 120B and 122B.

In some embodiments, the pWFM layers can include substantially Al-free (e.g., with no Al) (i) Ti-based nitrides or alloys, such as TiN, TiSiN, titanium gold (Ti—Au) alloy, titanium copper (Ti—Cu) alloy, titanium chromium (Ti—Cr) alloy, titanium cobalt (Ti—Co) alloy, titanium molybdenum (Ti—Mo) alloy, or titanium nickel (Ti—Ni) alloy; (ii) Ta-based nitrides or alloys, such as TaN, TaSiN, Ta—Au alloy, Ta—Cu alloy, Ta—W alloy, tantalum platinum (Ta—Pt) alloy, Ta—Mo alloy, Ta—Ti alloy, or Ta—Ni alloy; or (iii) a combination thereof. In some embodiments, the pWFM layers can include a thickness ranging from about 1 nm to about 3 nm. The thickness within this range can allow pWFM layers to be wrapped around nanostructured channel regions 120B and 122B for low threshold voltage without being constrained by the spacing between adjacent nanostructured channel regions 120B and 122B.

Gate metal fill layers 132 can include a single metal layer or a stack of metal layers. The stack of metal layers can include metals different from each other. In some embodiments, gate metal fill layers 132 can include a suitable conductive material, such as W, Ti, Ag, ruthenium (Ru), Mo, Cu, cobalt (Co), Ni, metal alloys, and/or combinations thereof. Though gate structures 112N1-112N4 and 112P1-112P4 are shown to have GAA structures, other gate structures (e.g., vertical GAA structures or gate structures without GAA structures) are within the scope and spirit of this disclosure.

Referring to FIGS. 1B-1C, gate spacers 114 and inner spacers 142 can form sidewalls of gate structures 112N1-112N4 and 112P1-112P4. Each of gate spacers 114 and/or inner spacers 142 can be in physical contact with interfacial oxide layers 127 and gate dielectric layers 128N1-128N4 and 128P1-128P4, according to some embodiments. Each of gate spacers 114 and inner spacer 142 can include insulating material, such as silicon oxide, silicon nitride, a low-k material, or a combination thereof. Each of gate spacers 114 and inner spacers 142 can have a low-k material with a dielectric constant less than about 3.9.

Referring to FIGS. 1A-1D, semiconductor device 100 can further include etch stop layer (ESL) 116, interlayer dielectric (ILD) layer 118, and shallow trench isolation (STI) regions 138. ESL 116 can be disposed on sidewalls of gate spacers 114 and on epitaxial regions 110A-110B. ESL 116 can be configured to protect gate structures 112N1-112N4 and 112P1-112P4 and/or S/D regions 126A-126B. In some embodiments, ESL 116 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material is silicon oxide. STI regions 138 can be configured to provide electrical isolation between NFETs 102N1-102N4 and PFETs 102P1-102P4 and neighboring FETs (not shown) on substrate 106 and/or neighboring active and passive elements (not shown) integrated with or deposited on substrate 106. In some embodiments, STI regions 138 can include silicon oxide, silicon nitride, silicon oxynitride, fluorine-doped silicate glass (FSG), a low-k dielectric material, and/or other suitable insulating materials.

The cross-sectional shapes of semiconductor device 100 and its elements (e.g., fin structure $108_1$-$108_2$, gate structures 112N1-112N4 and 112P1-112P4, epitaxial fin regions 110A-110B, inner spacers 142, gate spacers 114, and/or STI regions 138) are illustrative and are not intended to be limiting.

Figure 2:
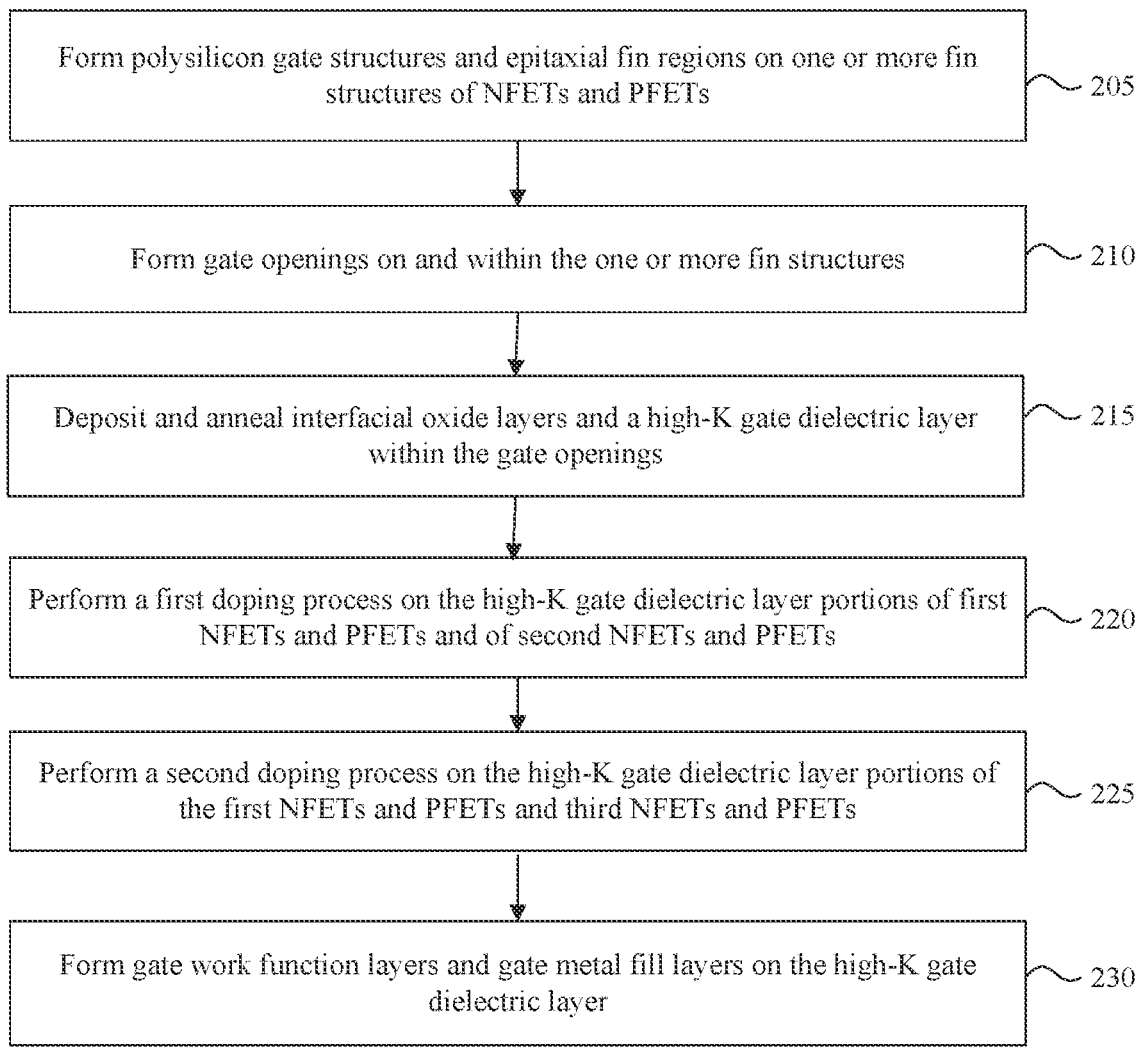
FIG. 2 is a flow diagram of a method for fabricating a semiconductor device with different gate structures, in accordance with some embodiments.

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-12A, 3B-12B, 8C-8D, and 11C-11E. FIGS. 3A-12B are cross-sectional views along lines A-A and B-B of semiconductor device 100 at various stages of fabrication, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3A-12A, 3B-12B, 8C-8D, and 11C-11E with the same annotations as elements in FIGS. 1A-1Q are described above.

In operation 205, polysilicon structures and epitaxial fin regions are formed on fin structures of NFETs and PFETs. For example, as shown in FIGS. 3A-3B, polysilicon structures 312 can be formed on fin structures $108_1$-$108_2$ and gate spacers 114 can be formed on sidewalls polysilicon structures 312. During subsequent processing, polysilicon structures 312 can be replaced in a gate replacement process to form gate structures 112N1-112N4 and 112P1-112P4. In some embodiments, the process for forming polysilicon structures 312 can include blanket depositing a layer of polysilicon material on fin structures $108_1$-$108_2$ and etching the blanket deposited layer of polysilicon material through patterned hard mask layers (not shown) formed on the layer of polysilicon material.

The blanket deposition of the layer of polysilicon material can include CVD, PVD, ALD, or other suitable deposition processes. In some embodiments, the etching of the blanket deposited layer of polysilicon material can include a dry etching process, a wet etching process, or a combination thereof. Following the formation of polysilicon structures 312, gate spacers 114 can be formed on sidewalls of polysilicon structures 312 as shown in FIGS. 3A-3B.

Referring to FIGS. 3A-3B, following the formation of gate spacers 114, n- and p-type epitaxial fin regions 110A-110B can be selectively formed on portions of fin structures $108_1$-$108_2$ (e.g., nanostructured regions 120A and 122A) that are not underlying polysilicon structures 312.

Prior to the formation of epitaxial fin regions 110A, PFETs 102P1-102P4 can be protected by patterning a photoresist layer (not shown) on PFETs 102P1-102P4. Epitaxial fin regions 110A can be grown on nanostructured regions 120A. In some embodiments, epitaxial fin regions 110A can be grown by (i) CVD, such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. N-type epitaxial fin regions 110A can include Si without any substantial amount of Ge (e.g., with no Ge) and can be in-situ doped during the epitaxial growth process using n-type dopants, such as phosphorus or arsenic. For n-type in-situ doping, n-type doping precursors such as, but not limited to, phosphine (PH3), arsine (AsH3), and/or other n-type doping precursor, can be used.

After the formation of epitaxial regions 110A, photoresist layer can be removed from PFETs 102P1-102P4 and another photoresist layer (not shown) can be patterned on NFETs 102N1-102N4 to protect NFETs 102N1-102N4 during the subsequent processing steps to form epitaxial regions 110B. Epitaxial fin regions 110B can be grown on nanostructured regions 122A. Epitaxial fin regions 110B can be grown similarly as epitaxial fin regions 110A, except p-type epitaxial fin regions 110B with SiGe can be in-situ doped during the epitaxial growth process using p-type dopants, such as boron, indium, or gallium. For p-type in-situ doping, p-type doping precursors such as, but not limited to, diborane ($B_2H_6$), boron trifluoride ($BF_3$), and/or other p-type doping precursors can be used. After the formation of epitaxial regions 110B, photoresist layer can be removed from NFETs 102N1-102N4 and ESL 116 and ILD 118 can be formed to form the structures of FIGS. 3A-3B.

Figures 4A, 4B:
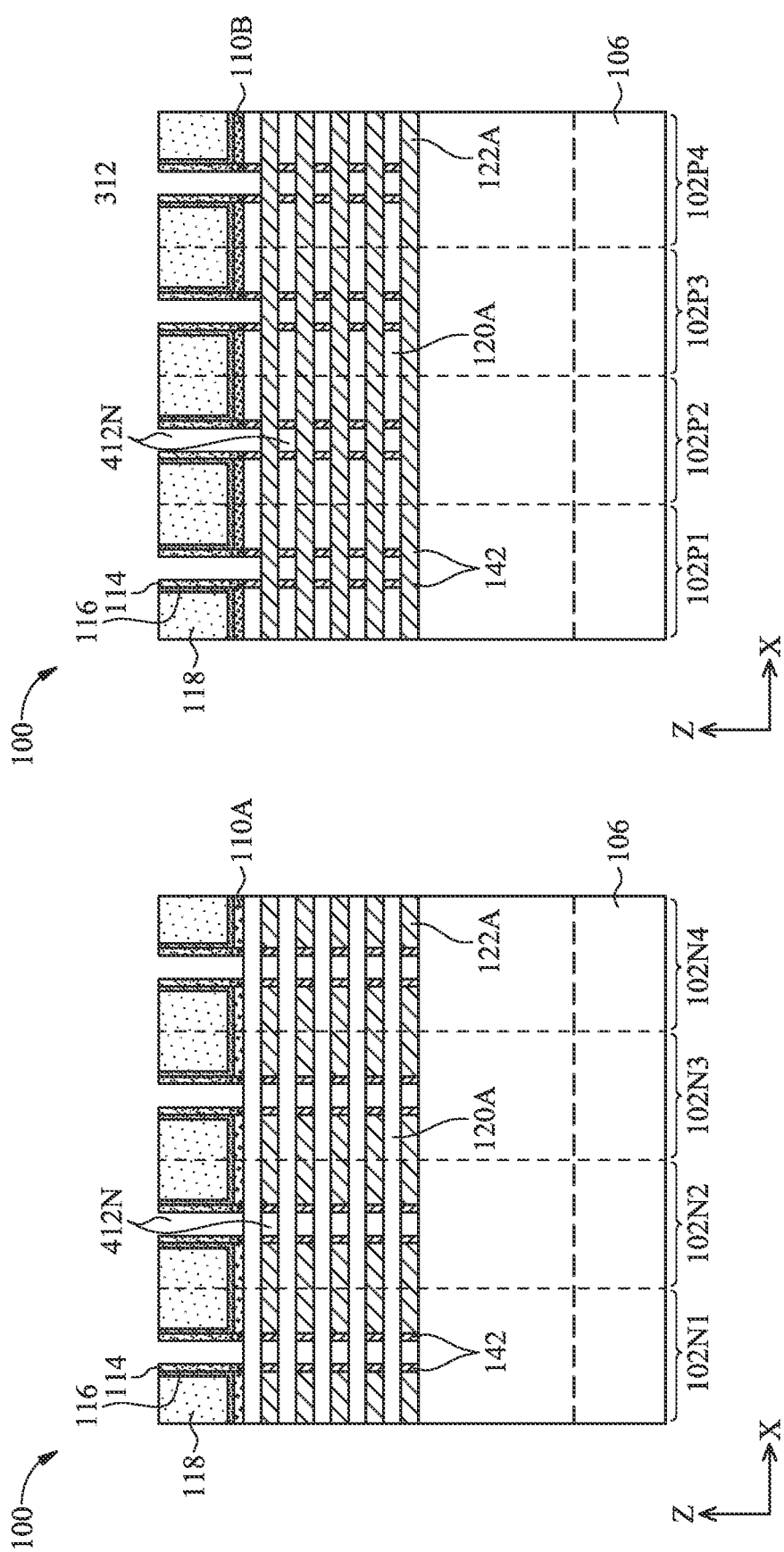

Referring to FIG. 2, in operation 210, gate openings are formed on and within the one or more fin structures. For example, as shown in FIGS. 4A-4B, gate openings 412N-412P associated with NFETs 102N1-102N4 and PFETs 102P1-102P4, respectively, can be formed to on and within fin structures $108_1$-$108_2$. The formation of gate openings 412N can include sequential steps of (i) forming a photoresist layer (not shown) on PFETs 102P1-102P4, (ii) etching polysilicon structures 312 of NFETs 102N1-102N4 from the structure of FIG. 3A, and (iii) etching nanostructured regions 122B from the structure of FIG. 3A. In some embodiments, the etching of nanostructured regions 122B can include using a dry etching process or a wet etching process with higher selectivity towards SiGe than Si. For example, the wet etching process can include using a mixture of sulfuric acid ($H_2SO_4$) and hydrogen peroxide ($H_2O_2$) (SPM) and/or a mixture of ammonia hydroxide ($NH_4OH$) with $H_2O_2$ and deionized (DI) water (APM).

Following the formation of gate openings 412N, gate openings 412P can be formed. The formation of gate openings 412P can include sequential steps of (i) removing photoresist layer from PFETs 102P1-102P4, (ii) forming a photoresist layer (not shown) within gate openings 412N to protect nanostructured channel regions 120B, (iii) etching polysilicon structure 312 of PFETs 102P1-102P4, and (iv) etching nanostructured regions 120B from the structure of FIG. 3B. In some embodiments, the etching of nanostructured regions 120B can include using a wet etching process with higher selectivity towards Si than SiGe. For example, the wet etching process can include using a mixture (NH$_4$OH) with HCl. Following the formation of gate openings 412P, photoresist layer can be removed from gate openings 412N to form the structures of FIGS. 4A-4B.

Referring to FIG. 2, in operations 215-230, gate-all-around (GAA) structures are formed in the gate openings. For example, using the steps described in operations 215-230, gate structures 112N1-112N4 and 112P1-112P4 can be formed wrapped around nanostructured channel regions 120B and 122B, as described with reference to FIGS. 5A-12B.

Figure 5A:
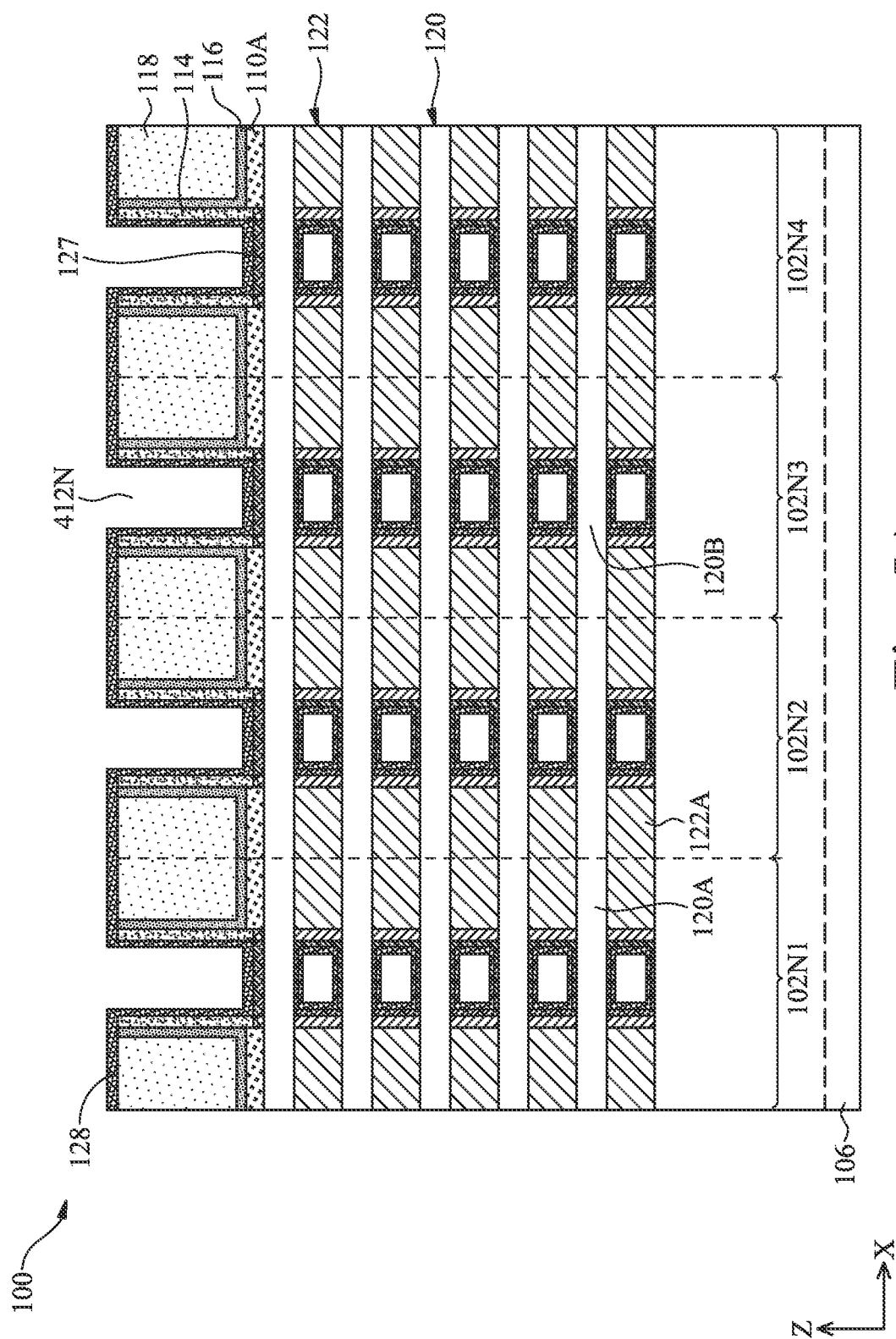
Figure 5B:
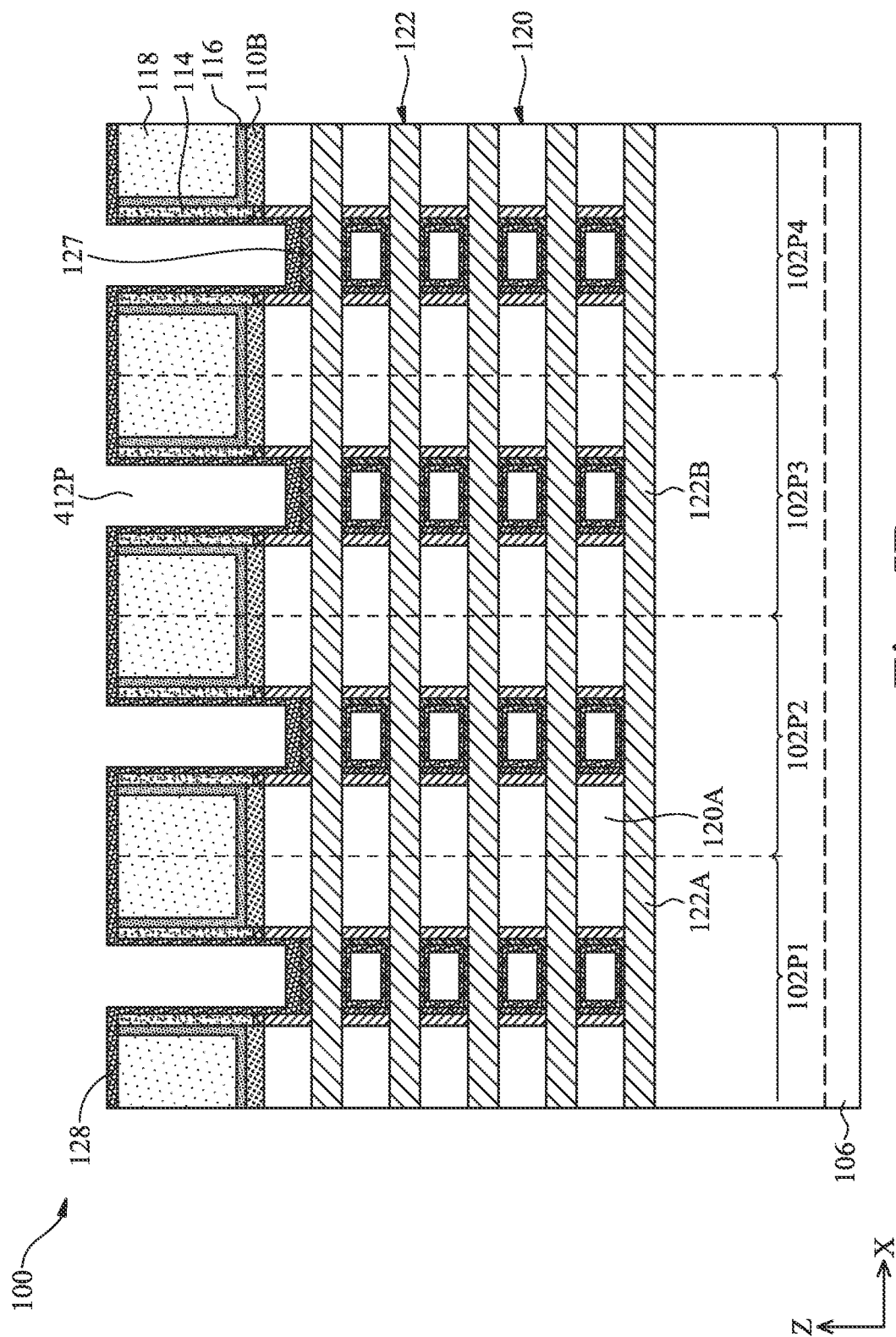
Figure 6A:
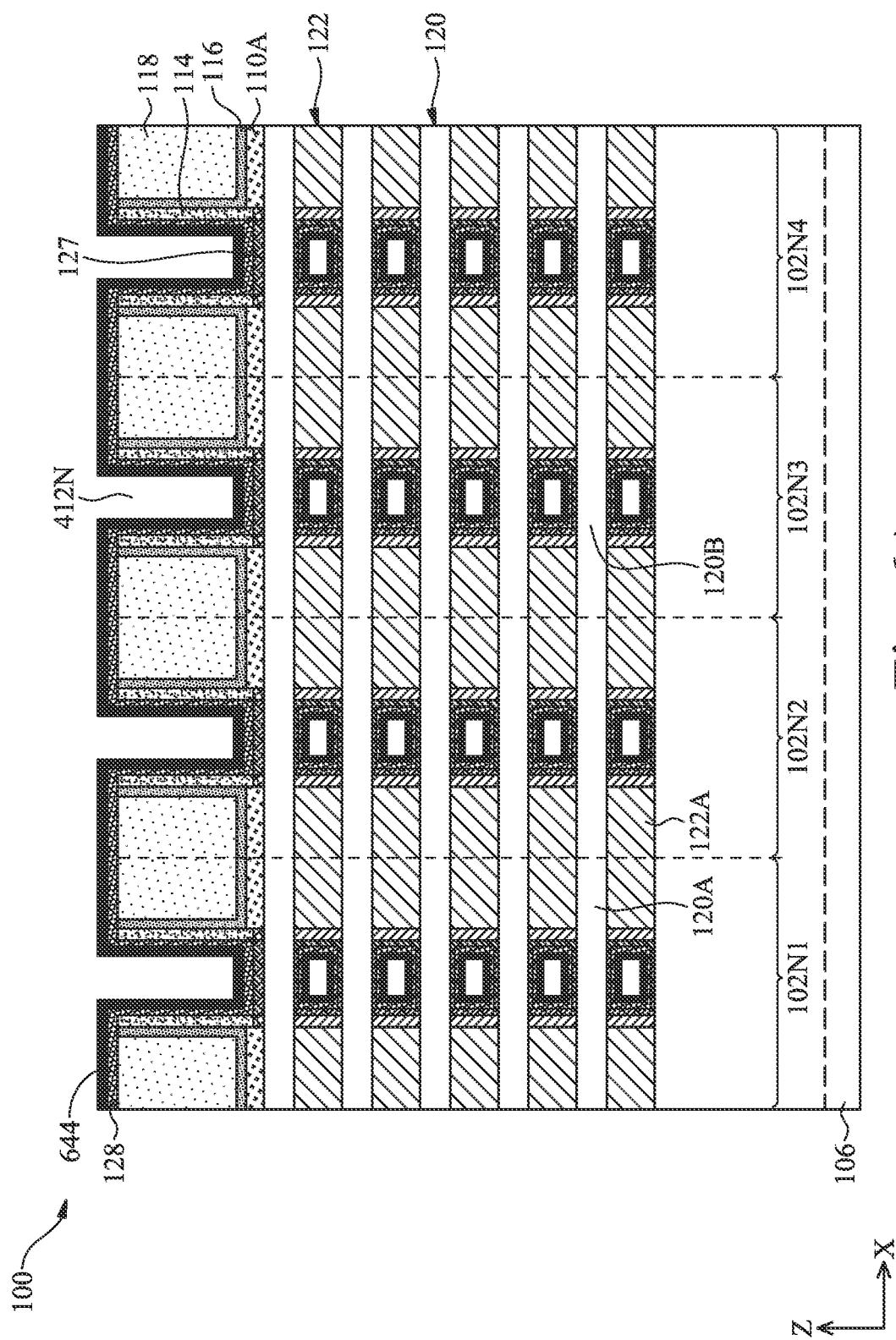
Figure 6B:
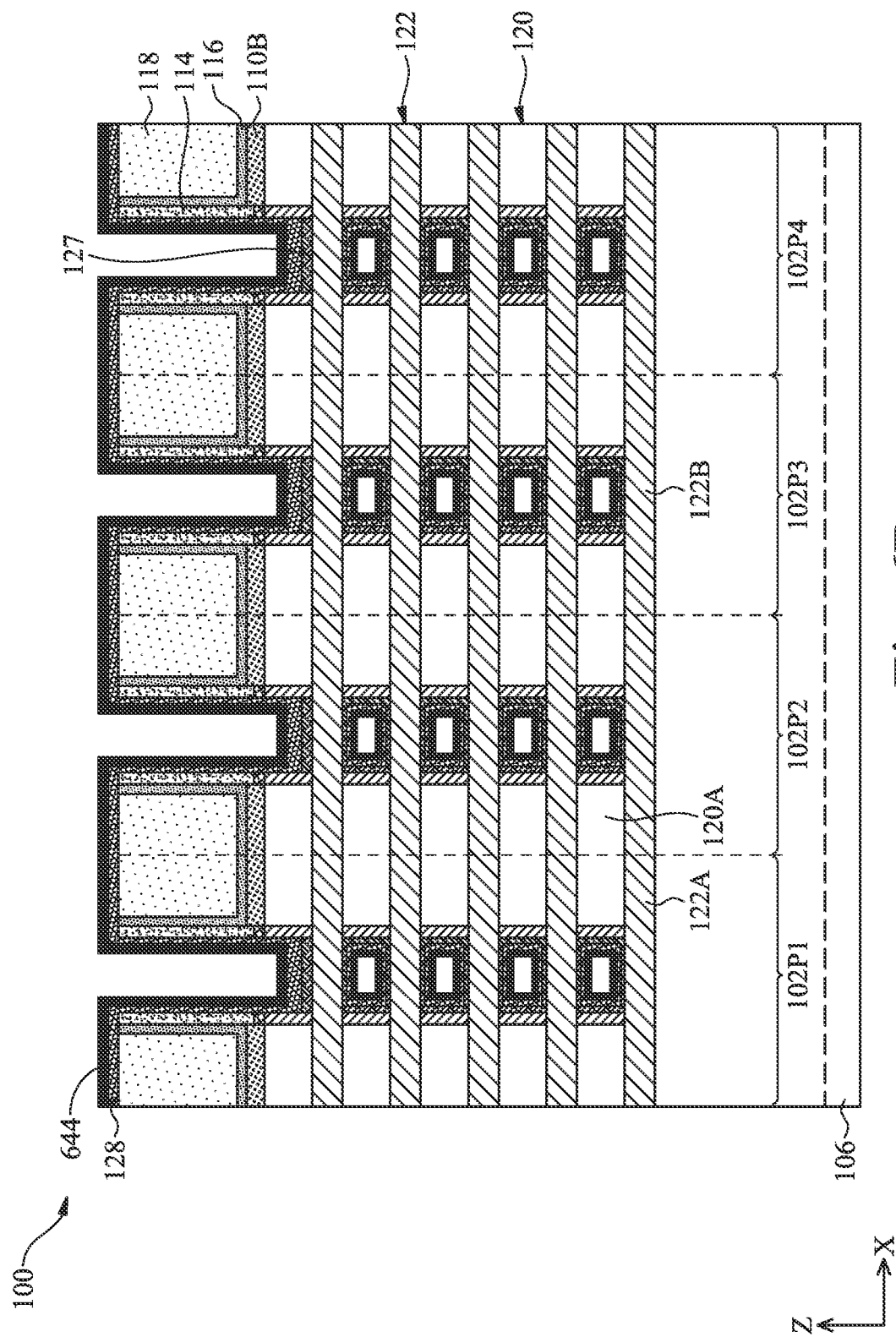

In operation 215, interfacial oxide layers and an HK gate dielectric layer are deposited and annealed within the gate openings. For example, as shown in FIGS. 5A-5B, interfacial oxide layers 127 and a gate dielectric layer 128 can be deposited and annealed on nanostructured channel regions 120B and 122B within gate openings 412N-412P (shown in FIGS. 4A-4B). During subsequent processing, HK gate dielectric layer 128 can form HK gate dielectric layers 128N1-128N4 and 128P1-138P4, as shown in FIGS. 1A-1C.

Interfacial oxide layers 127 can be formed on exposed surfaces of nanostructured channel regions 120B and 122B within gate openings 412N-412P, respectively. In some embodiments, interfacial oxide layers 127 can be formed by exposing nanostructured channel regions 120B and 122B to an oxidizing ambient. For example, the oxidizing ambient can include a combination of ozone (O$_3$), a mixture of ammonia hydroxide, hydrogen peroxide, and water (SC1 solution), and/or a mixture of hydrochloric acid, hydrogen peroxide, water (SC2 solution). As a result of the oxidation process, oxide layers ranging from about 0.5 nm to about 1.5 nm can be formed on the exposed surfaces of nanostructured channel regions 120B and 122B.

The deposition of HK gate dielectric layer 128 can include blanket depositing HK gate dielectric layer 128 on the partial semiconductor device 100 (not shown) formed after the formation of interfacial oxide layers 127. The blanket deposited HK gate dielectric layer 128 can be substantially conformally deposited on interfacial oxide layers 127 and the exposed surfaces of the partial semiconductor device 100 (e.g., sidewalls of the gate openings 412N-412P and top surfaces of ILD 118), as shown in FIGS. 5A-5B. In some embodiments, HK gate dielectric layer 128 can include a dielectric material with a dielectric constant (k-value) higher than about 3.9. In some embodiments, HK gate dielectric layer 128 can include (i) a high-k dielectric material, such as hafnium oxide (HfO$_2$), TiO$_2$, HfZrO, Ta$_2$O$_3$, HfSiO$_4$, ZrO$_2$, ZrSiO$_2$, (ii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iii) a combination thereof. In some embodiments, HK gate dielectric layer 128 can be formed with ALD using hafnium chloride (HfCl$_4$) as a precursor at a temperature ranging from about 250° C. to about 350° C. In some embodiments, gate dielectric layer 128 can have a thickness ranging from about 1 nm to about 3 nm in order to wrap around nanostructures channel regions 120B and 122B without being constrained by spacing between adjacent nanostructured channel regions 120B and between adjacent nanostructured channel regions 122B.

Figure 7A:
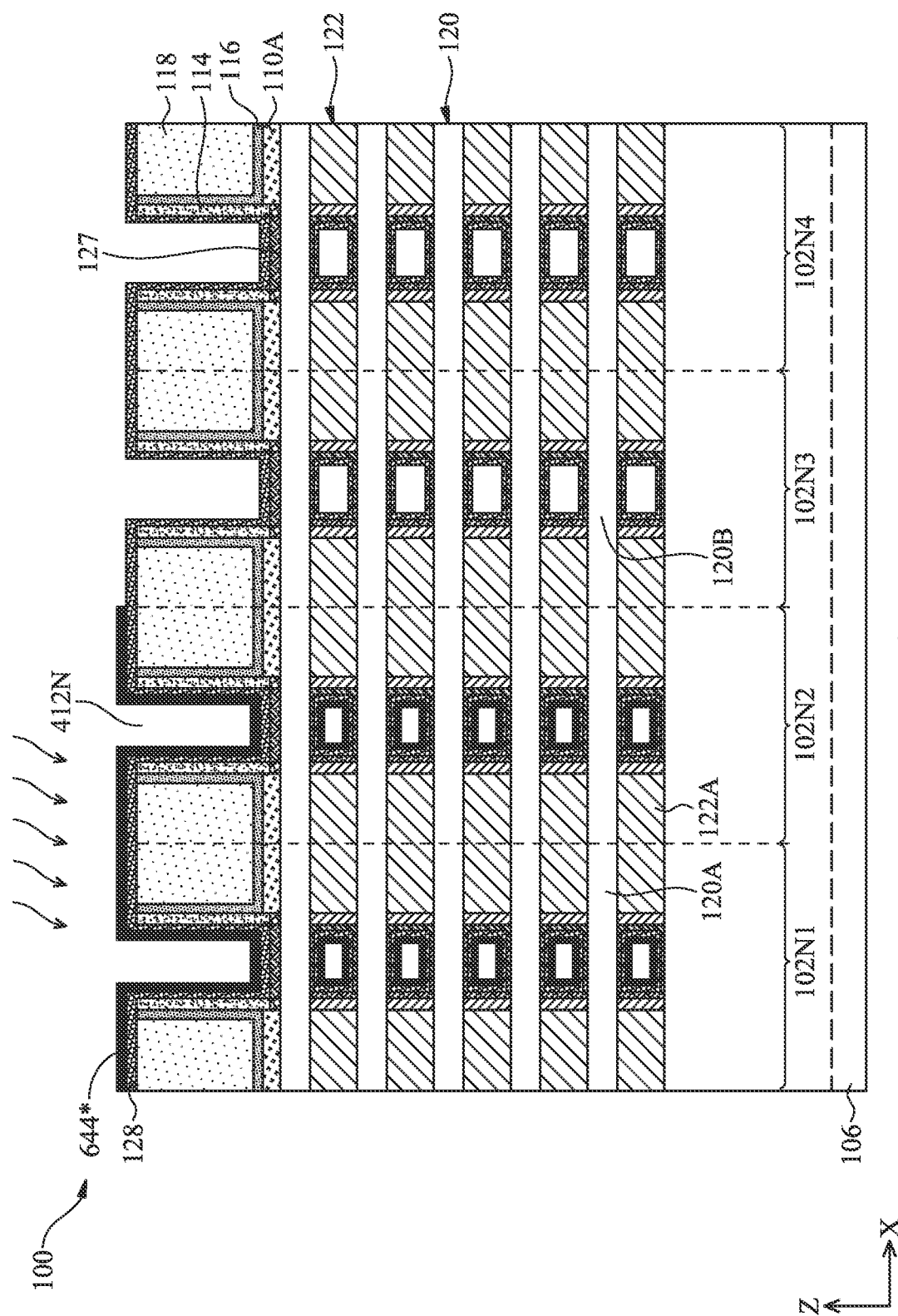
Figure 7B:
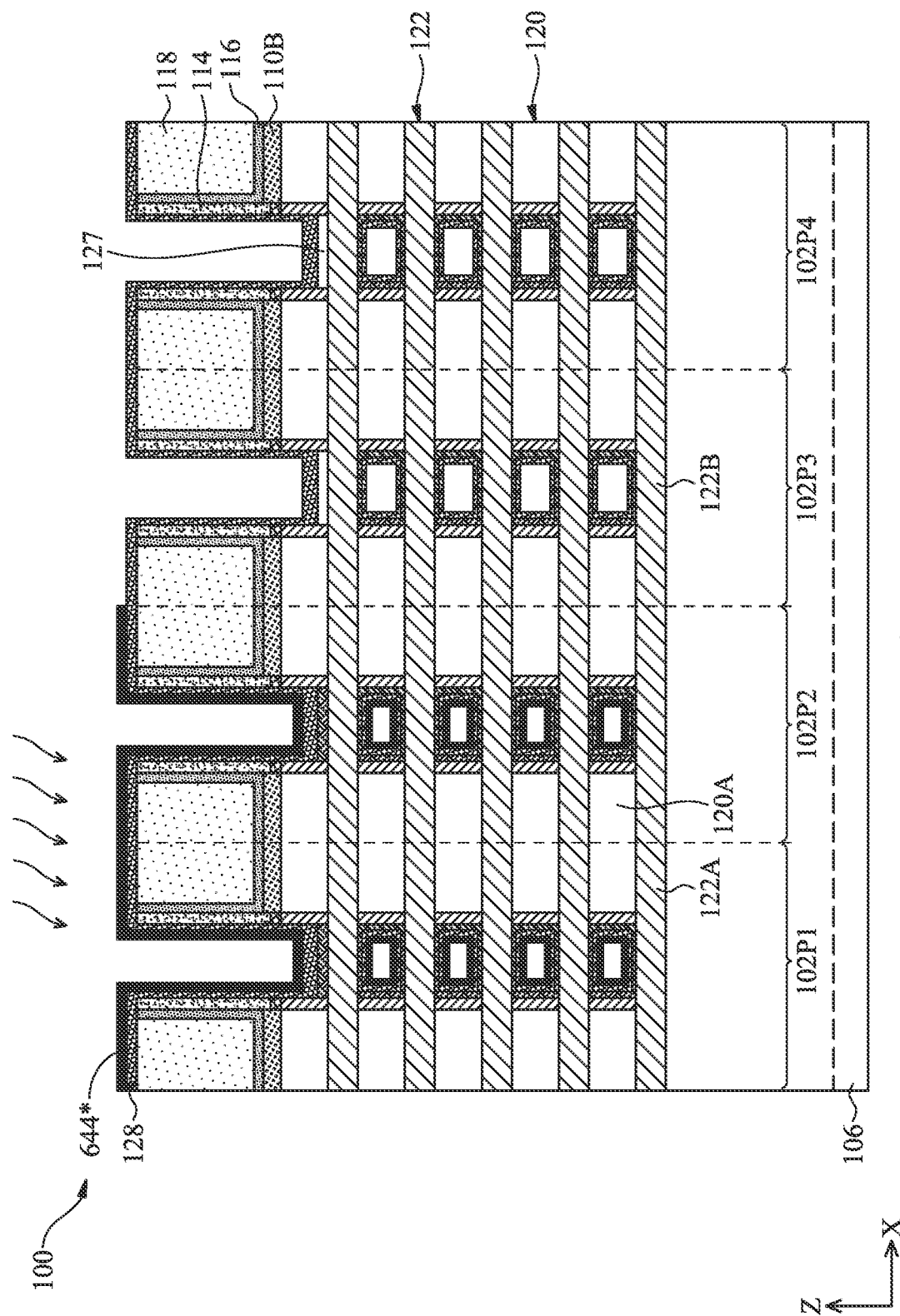

Referring to FIG. 2, in operation 220, a first doping process is selectively performed on the HK gate dielectric layer portions of first NFETs and PFETs and second NFETs and PFETs. For example, as shown in FIGS. 6A-7B and 8A-8D, portions of HK gate dielectric layer 128 within gate openings 412N-412P of NFETs 102N1-102N2 and PFETs 102P1-102P2 can be doped with REM-based dopants to form dipole layers 129N1*-129N2 and 129P1*-129P2. The first doping process can include sequential steps of (i) blanket depositing an REM-based layer 644 (FIGS. 6A-6B) on the structures of FIGS. 5A-5B, (ii) patterning REM-based layer 644 to form patterned REM-based layer 644* on portions of HK gate dielectric layer 128 within gate openings 412N-412P of NFETs 102N1-102N2 and PFETs 102P1-102P2 as shown in FIGS. 7A-7B, (iii) performing a drive-in anneal process ("first drive-in anneal process") on the patterned REM-based layer 644* as shown in FIGS. 7A-7B, and (iv) removing the patterned REM-based layer 644* to form the structures of FIGS. 8A-8B.

The blanket deposition of REM-based layer 644 can include blanket depositing about 0.05 nm to about 0.4 nm thick REM-based layer 644 on HK gate dielectric layer 128 with an ALD or a CVD process. The REM-based layer 644 can include (i) REMs, such as Lanthanum (La), Yttrium (Y), Cerium (Ce), Ytterbium (Yb), Erbium (Er), or a combination thereof and/or (ii) oxides of REM, such as Lanthanum oxide (La$_2$O$_3$), Yttrium oxide (Y$_2$O$_3$), Cerium oxide (CeO$_2$), Ytterbium oxide (Yb$_2$O$_3$), Erbium oxide (Er$_2$O$_3$), or a combination thereof. The patterning of REM-based layer 644 can include using lithography and etching processes. In some embodiments, the etching process can include using acid-based (e.g., HCl-based) chemical etching. The first drive-in anneal process can include annealing the patterned REM-based layer 644* at a temperature from about 550° C. to about 850° C. and at a pressure from about 1 torr to about 30 torr for a time period ranging from about 0.1 sec to about 30 sec. In some embodiments, the first drive-in anneal process can include two anneal processes: (i) a soak anneal process at a temperature from about 550° C. to about 850° C. for a time period ranging from about 2 sec to about 60 sec and (ii) a spike anneal process at a temperature from about 700° C. to about 900° C. for a time period ranging from about 0.1 sec to about 2 sec.

Figure 8A:
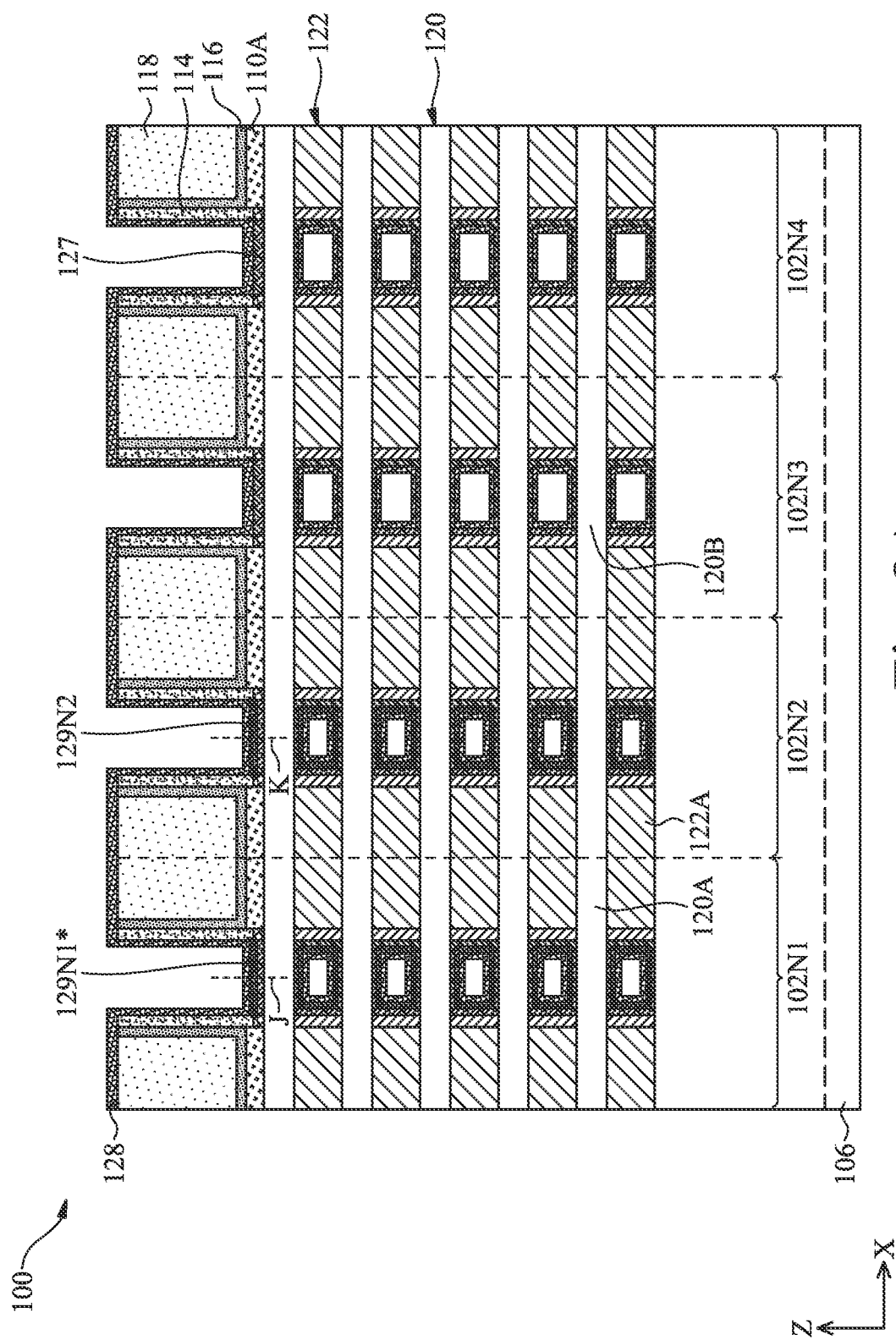
Figure 8B:
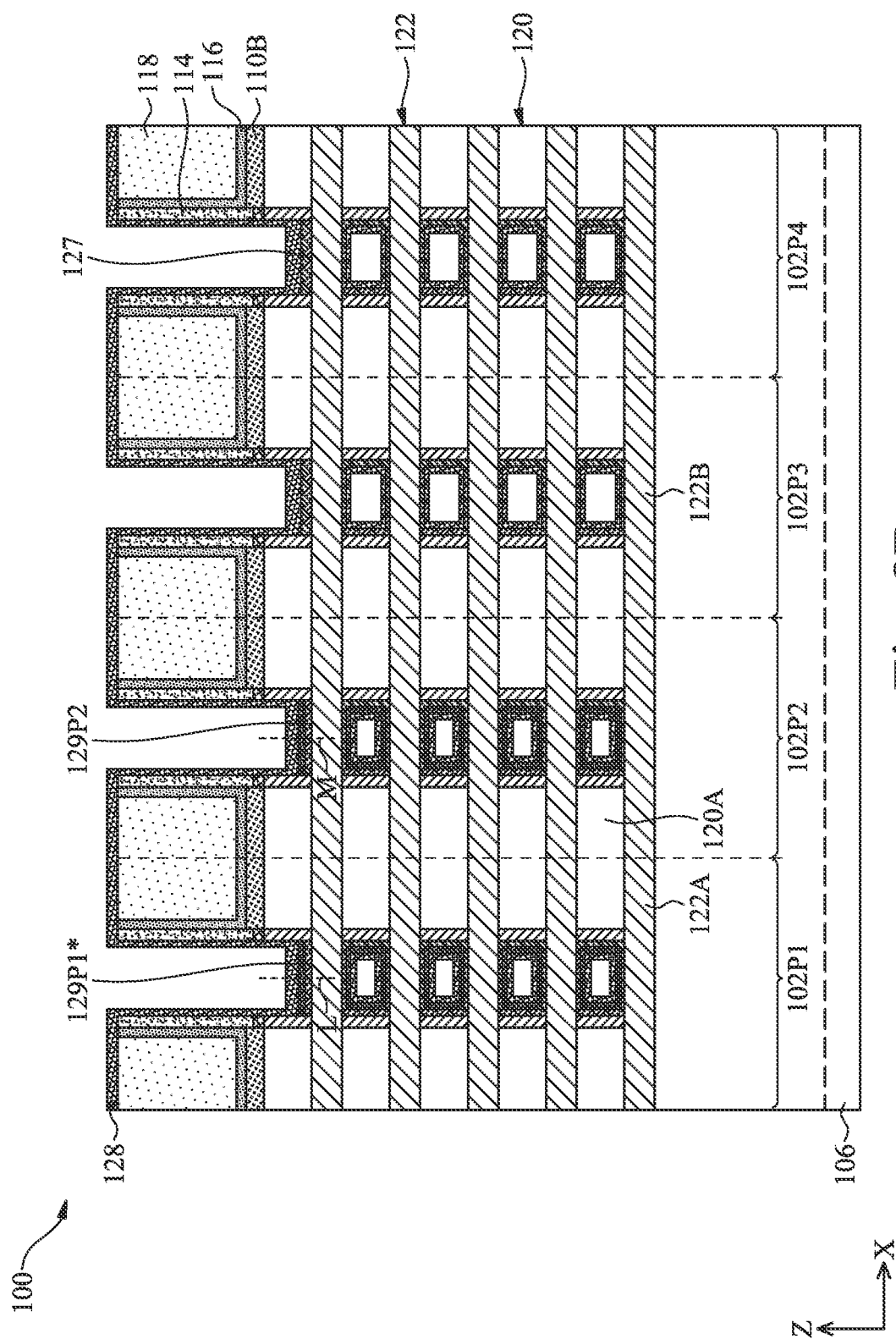
Figure 8C:
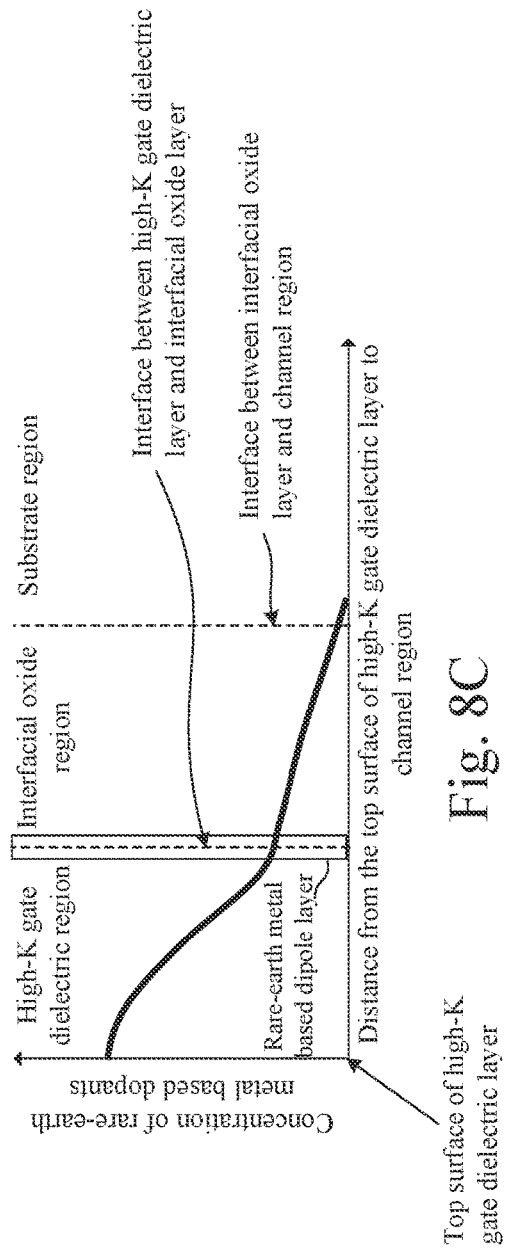

Following the first drive-in anneal process, the doped portions of HK gate dielectric layer 128 within gate openings 412N-412P of NFETs 102N1-102N2 and PFETs 102P1-102P2 can have REM-based dopant concentration C2 as discussed above with reference to FIGS. 1A-1C and 1H-1I. In some embodiments, following the first drive-in anneal process, dipole layers 129N1*-129N2 and 129P1*-129P2 can be formed at the interfaces between interfacial oxide layers 127 and the doped portions of HK gate dielectric layer 128 as shown in FIGS. 8A-8B. Dipole layers 129N1*-129N2 and 129P1*-129P2 can have REM-based dipole concentration D2 as discussed above with reference to FIGS. 1J-1M.

In some embodiments, following the first drive-in process, the REM-based dopants in HK gate dielectric layer 128, REM-based dipole layers 129N1*-129N2, interfacial oxide layers 127, and nanostructured channel regions 120B of NFETs 102N1-102N2 can have graded doping profiles (shown in FIG. 8C) along lines J and/or K of FIG. 8A. Similarly, the REM-based dopants in HK gate dielectric layers 128, REM-based dipole layers 129P1*-129P2, interfacial oxide layers 127, and nanostructured channel regions 122B of PFETs 102P1-102P2 can have graded doping profiles (shown in FIG. 8C) along lines L and/or M of FIG. 8B.

Figure 8D:
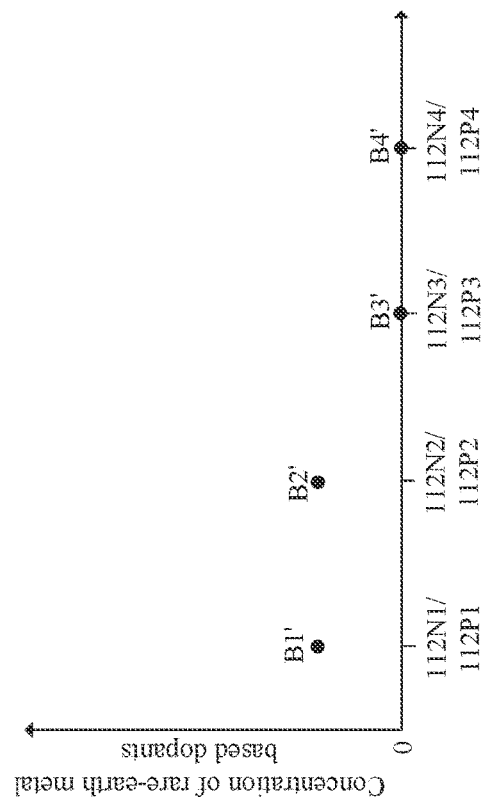
Figure 9A:
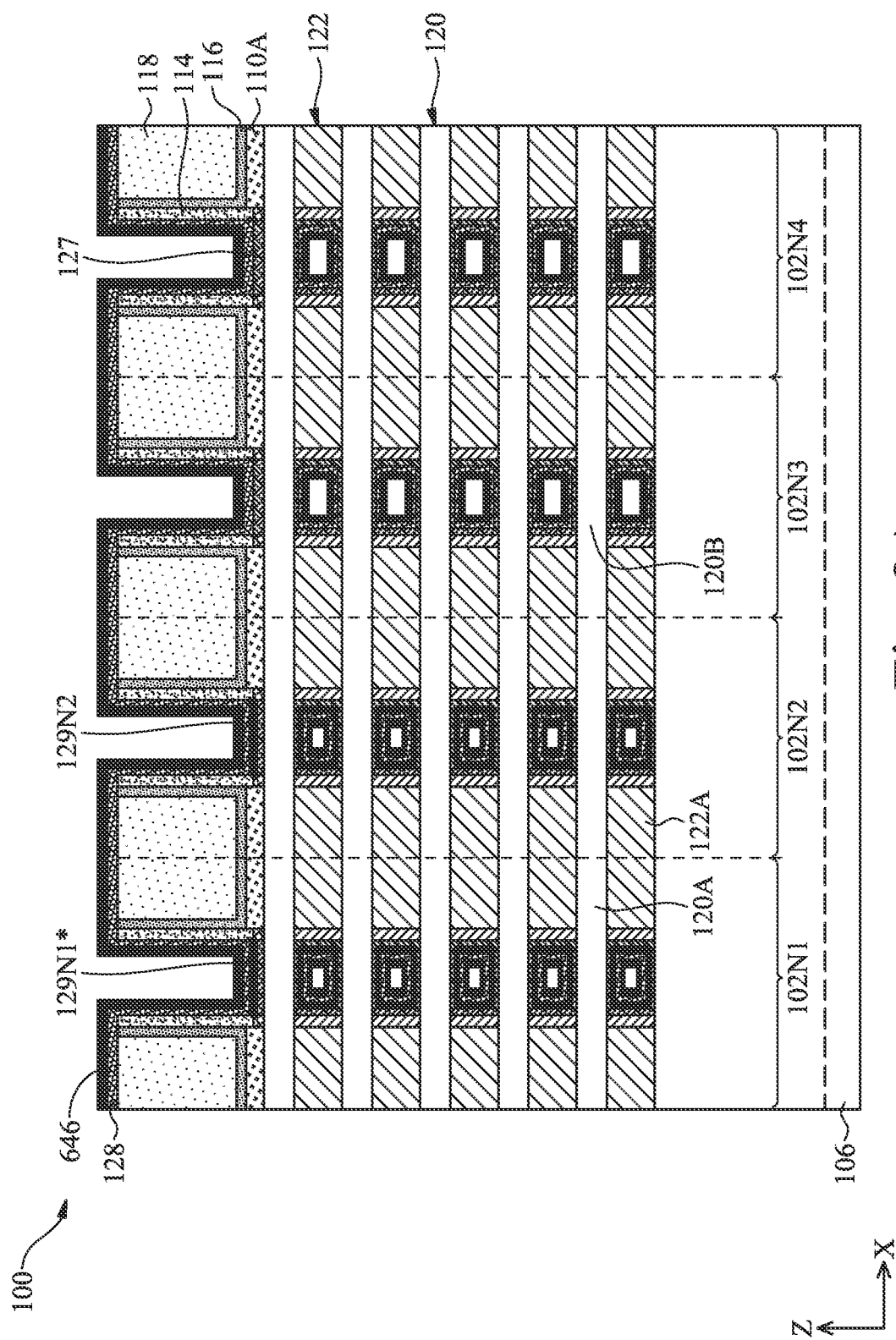
Figure 9B:
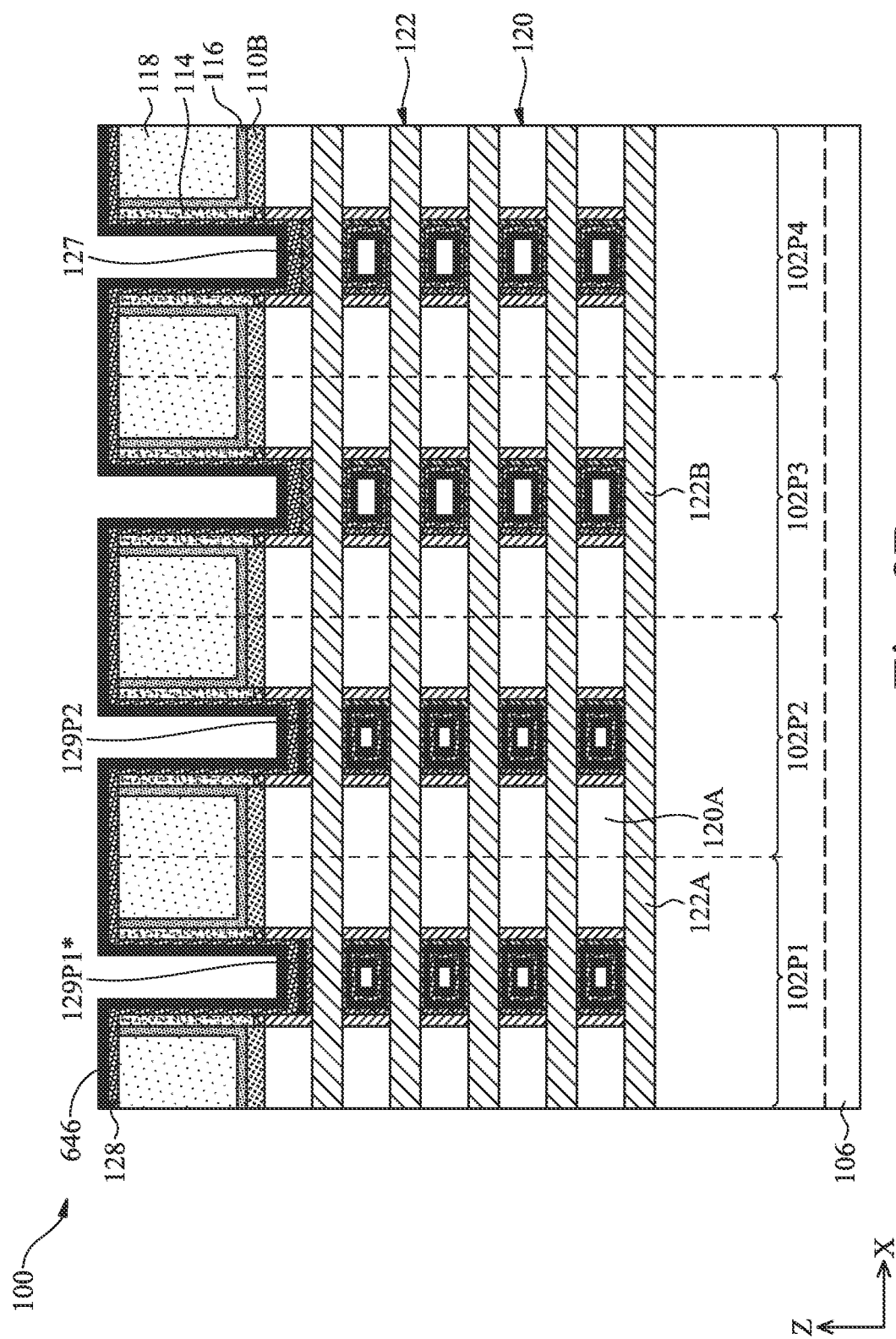

In some embodiments, following the first drive-in process, the interfaces between HK gate dielectric layer 128 and interfacial layers 127 of NFET gate structures 112N1-112N4 can have REM-based dopant concentrations B1'-B4' shown in FIG. 8D, where concentration B1' is equal to concentration B2' and concentrations B3'-B4' are equal to zero. Concentrations B1'-B2' can depend on the thickness of REM-based layer 644 and/or the first drive-in anneal temperature.

Figure 10A:
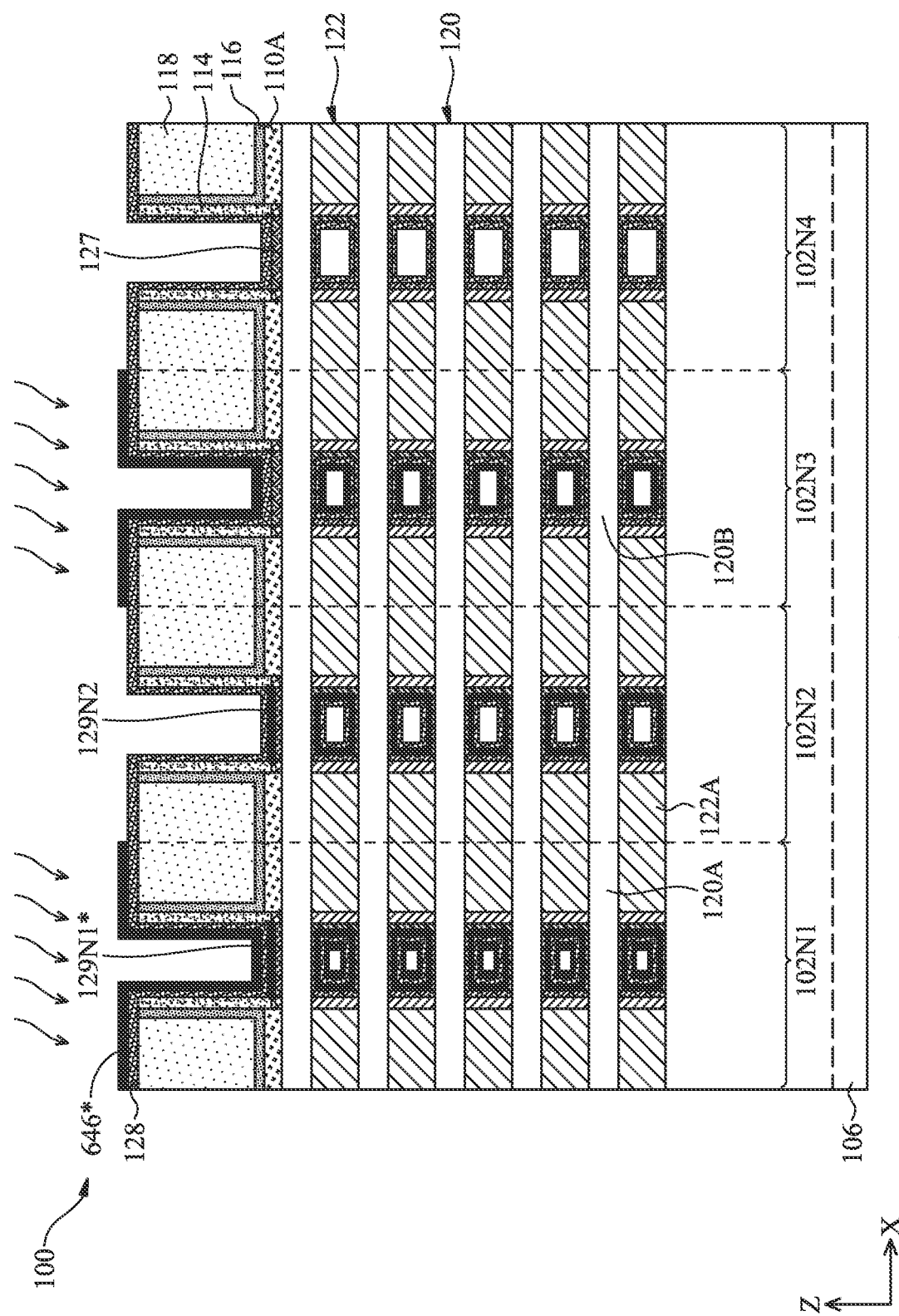
Figure 10B:
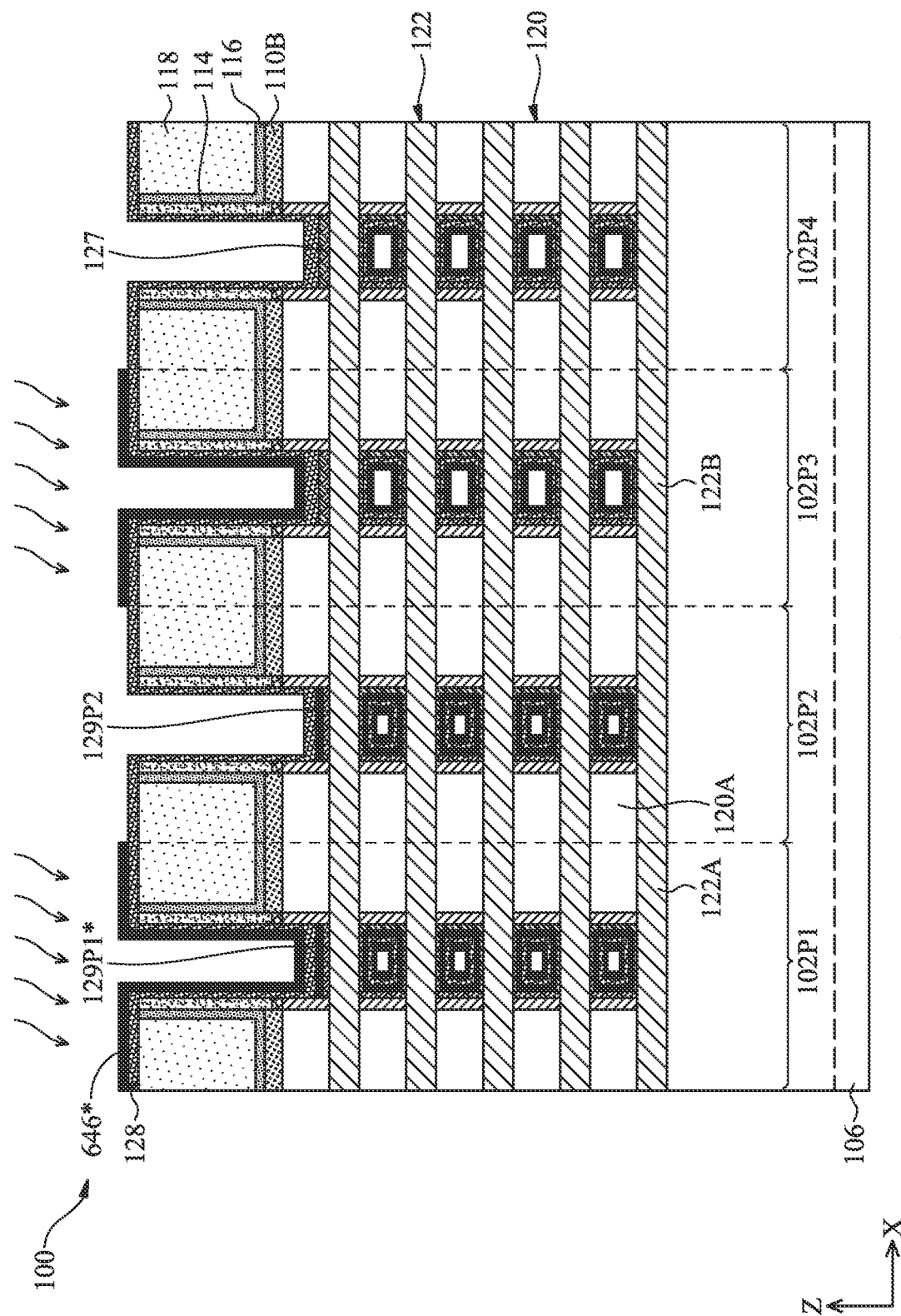

Referring to FIG. 2, in operation 225, a second doping process is selectively performed on the HK gate dielectric layer portions of first NFETs and PFETs and third NFETs and PFETs. For example, as shown in FIGS. 9A-10B and 11A-11E, portions of HK gate dielectric layer 128 within gate openings 412N-412P of NFETs 102N1 and 102N3 and PFETs 102P1 and 102P3 can be doped with REM-based dopants to form dipole layers 129N1 and 129N3 and 129P1 and 129P3. The second doping process can include sequential steps of (i) blanket depositing an REM-based layer 646 (FIGS. 9A-9B) on the structures of FIGS. 8A-8B, (ii) patterning REM-based layer 646 to form patterned REM-based layer 646* on portions of HK gate dielectric layer 128 within gate openings 412N-412P of NFETs 102N1 and 102N3 and PFETs 102P1 and 102P3 as shown in FIGS. 10A-10B, (iii) performing a drive-in anneal process ("second drive-in anneal process") on the patterned REM-based layer 646* as shown in FIGS. 10A-10B, and (iv) removing the patterned REM-based layer 646* to form the structures of FIGS. 11A-11B.

The blanket deposition and patterning of REM-based layer 646 can be similar to that of REM-based layer 644. In some embodiments, REM-based layer 646 can have material and/or structure composition similar to or different from REM-based layer 644. In some embodiments, the drive-in annealing of the patterned REM-based layer 646* can be similar to or different from that of patterned REM-based layer 646*. In some embodiments, the temperatue of the first drive-in anneal process (e.g., temperature from about 550° C. to about 850° C.) is higher than the temperature of the second drive-in thermal (e.g., temperature from about 550° C. to about 700° C.). Following the second drive-in anneal process of the second doping process, the REM-based dopant concentration of the doped portions of HK gate dielectric layer 128 within gate openings 412N-412P of NFET 102N1 and PFET 102P1 increases from concentration C2 to C1 as result of the first and second doping processes. Also, the doped portions of HK gate dielectric layer 128 within gate openings 412N-412P of NFET 102N3 and PFET 102P3 can have REM-based dopant concentration C3 as discussed above with reference to FIGS. 1A-1C and 1H-1I. In some embodiments, following the second drive-in anneal process of the second doping process, dipole layers 129N1, 129N3, 129P1, and 129P3 shown in FIGS. 11A-11B can be formed at the interfaces between interfacial oxide layers 127 and the portions of HK gate dielectric layer 128 doped in the second doping process.

Figure 11A:
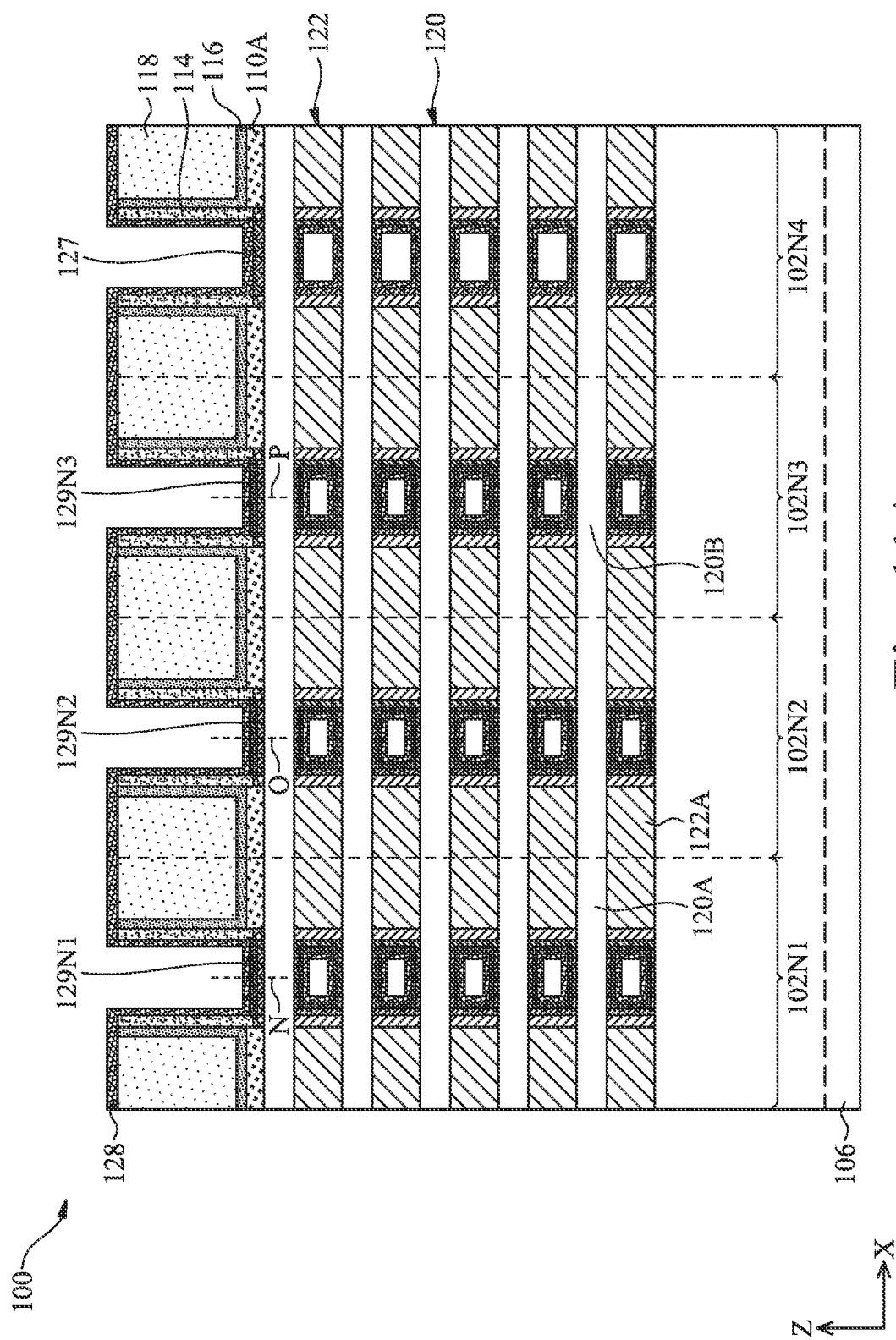
Figure 11B:
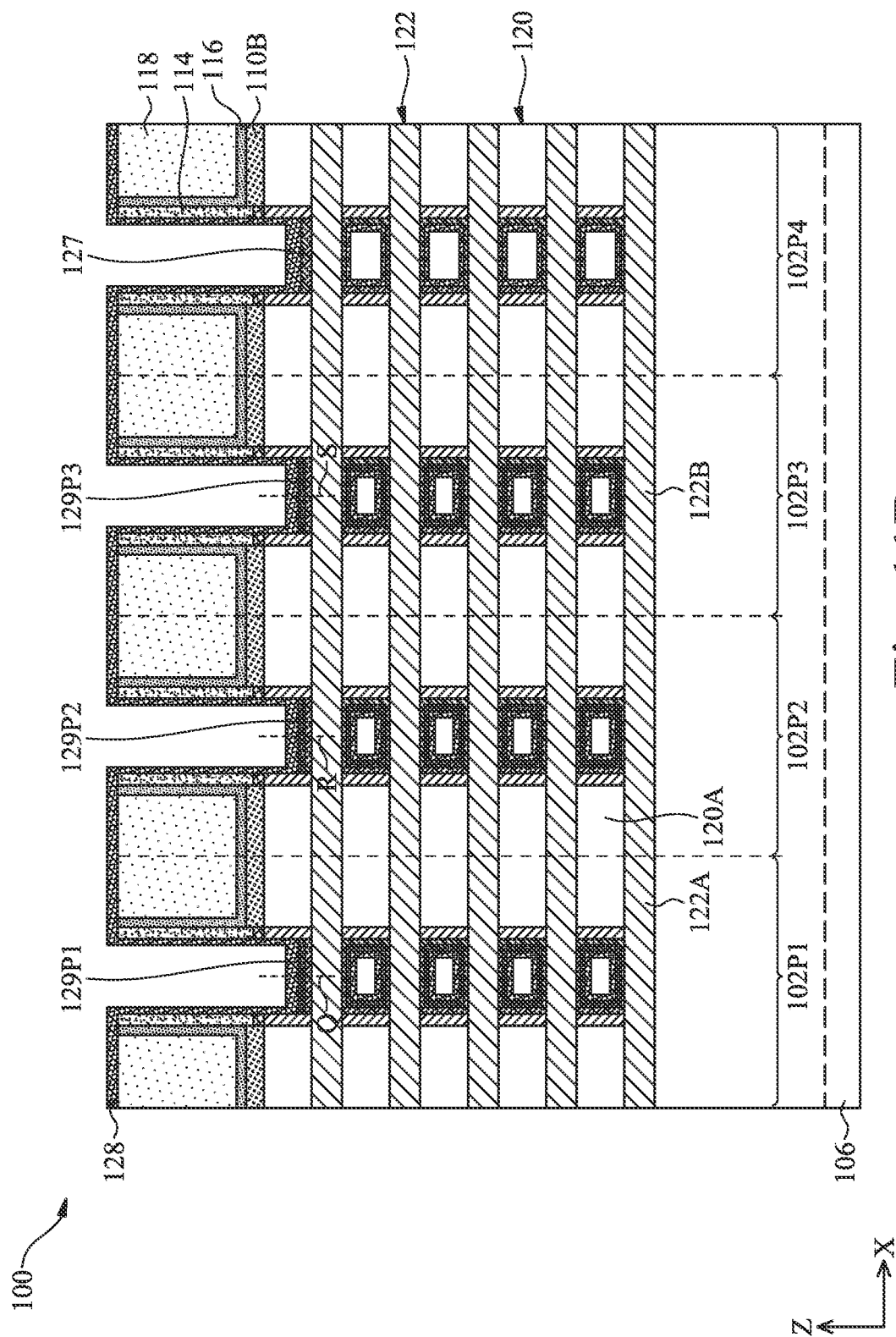

In some embodiments, following the second drive-in process, the REM-based dopants in HK gate dielectric layer 128, REM-based dipole layers 129N1-129N3, interfacial oxide layers 127, and nanostructured channel regions 120B of NFETs 102N1-102N3 can have graded doping profiles (dashed line of FIG. 11C) along lines N, O, and/or P of FIG. 11A. FIG. 11C shows that the concentration of REM-based dopants can decrease in HK gate dielectric layer 128 and increase in interfacial oxide layers 127 after the second drive-in anneal process compared to the concentration of REM-based dopants in HK gate dielectric layer 128 and interfacial oxide layers 127 after the first drive-in anneal process as shown in FIG. 11C. Similar to NFETs 102N1-102N3, following the second drive-in process, the REM-based dopants in HK gate dielectric layers 128, REM-based dipole layers 129P1-129P3, interfacial oxide layers 127, and nanostructured channel regions 122B of PFETs 102P1-102P2 can have graded doping profiles along lines Q, R, and/or S of FIG. 8B.

Referring to FIG. 11D-11E, in some embodiments, following the second drive-in process, REM-based dopant concentrations at the interfaces between HK gate dielectric layer 128 and interfacial layers 127 of NFET gate structures 112N1-112N4 can increase from concentration B1' to B1 or B5, from concentration B2' to B2 or B6, and from concentration B3' to B3 or B7. In some embodiments, concentrations B5 and B7 can be greater than concentrations B1 and B3, respectively, when REM-based layer 646* is thicker than REM-based layer 644* and/or the second drive-in anneal temperature is greater than the first drive-in anneal temperature.

Figure 12A:
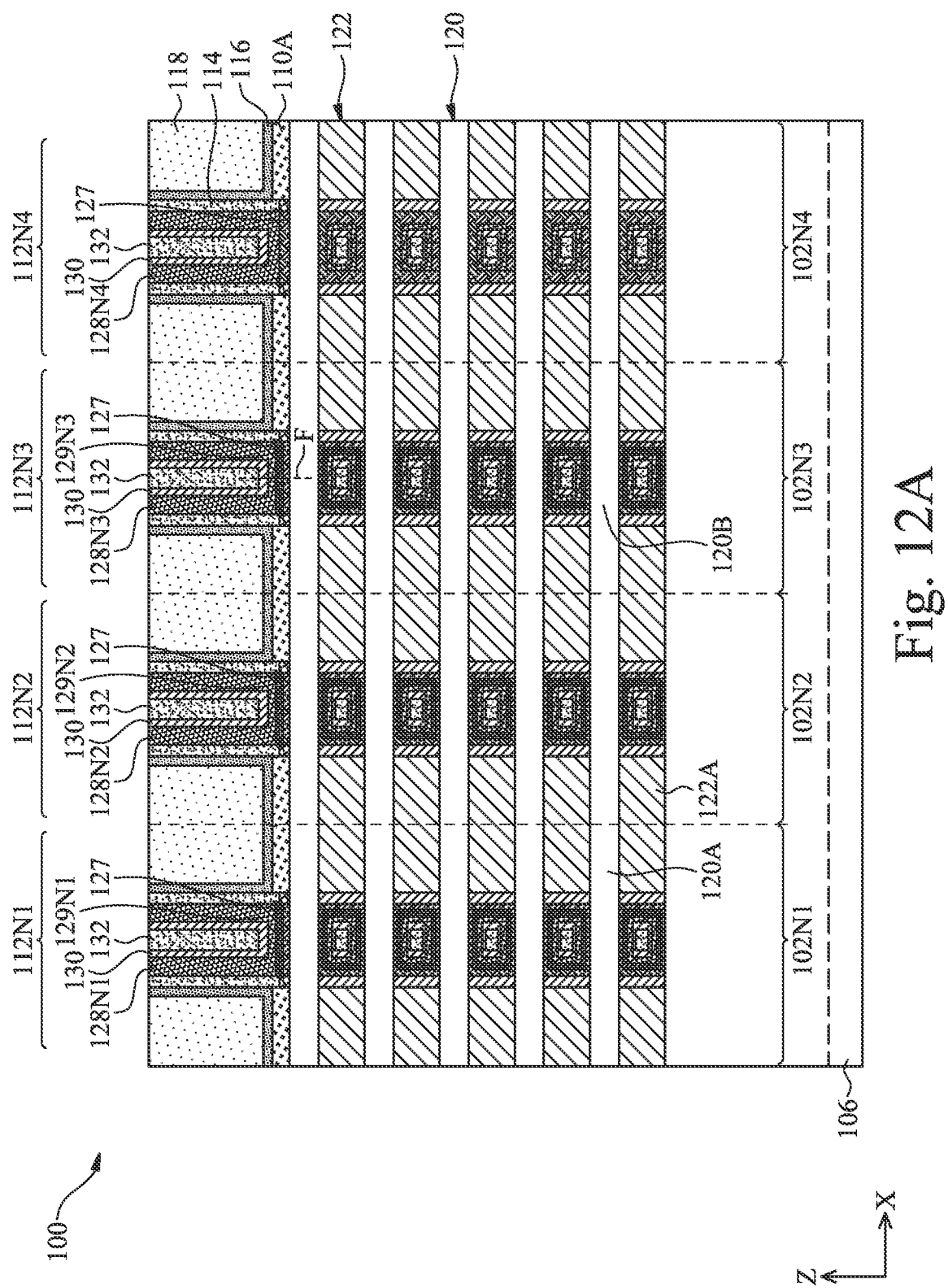
Figure 12B:
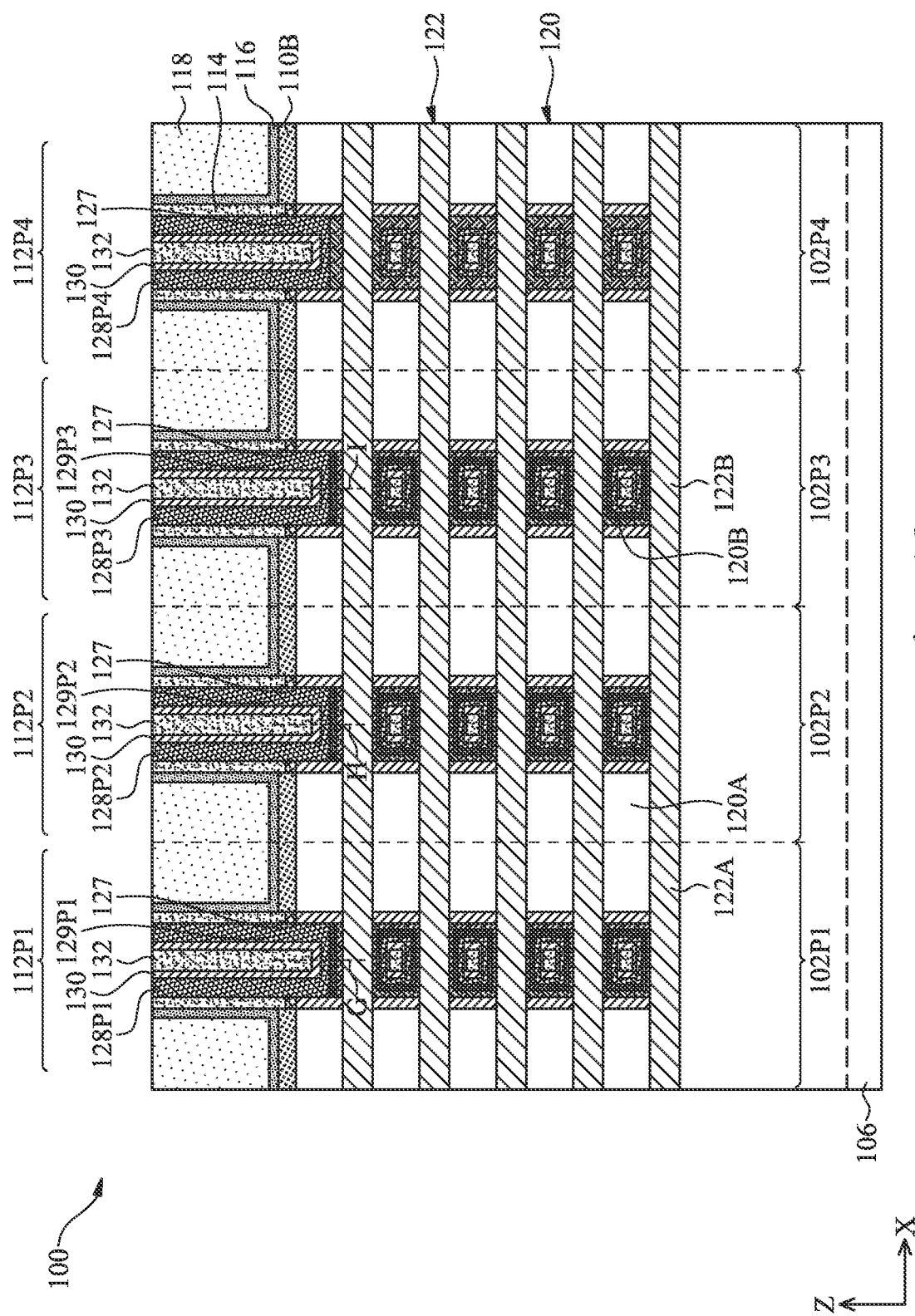

Referring to FIG. 2, in operation 230, gate WFM layers and gate metal fill layers are formed on the HK gate dielectric layer. For example, as shown in FIGS. 12A-12B, gate WFM layers 130 and gate metal fill layers 132 can be formed on the structures of FIGS. 11A-11B. The material for gate WFM layers 130 can be blanket deposited on the structures of FIGS. 11A-11B and the material for gate metal fill layers 132 can be blanket deposited on the material for gate WFM layers 130. Following these blanket depositions, HK gate dielectric layer 128, the material for gate WFM layers 130, and the material for gate metal fill layers 132 can be polished by a chemical mechanical polishing process to form the structures of FIGS. 12A-12B. Thus, as described in operations 215-230, using dual REM-based layers and dual doping process, gate structures 112N1-112N4 and 112P1-112P4 can be formed with at least four different REM-based dopant concentrations and REM-based dipole concentrations, leading to gate structures 112N1-112N4 and 112P1-112P4 with at least four different threshold voltages.

The present disclosure provides example structures of FETs (e.g., NFETs 102N1-102N4, PFETs 102P1-102P4) with gate structures of different effective work function values to provide different and/or low threshold voltages and example methods of forming such FETs on a same substrate. The example methods form FETs of different conductivity types with different effective work function values without increasing the thickness of the WFM layers. These example methods can be less complicated and more cost-effective in manufacturing reliable gate structures in FETs with nanostructured channel regions and with different and/or low threshold voltages than other methods of forming FETs with similar channel dimensions and threshold voltages on the same substrate. In addition, these example methods can form FET gate structures with smaller dimensions (e.g., thinner gate stacks) than other methods of forming FETs with similar threshold voltages.

In some embodiments, NFETs and PFETs with different gate structure configurations can be selectively formed on the same substrate. To achieve NFETs and PFETs with different and/or low threshold voltages, HK gate dielectric layers (e.g., HK gate dielectric layers 128N1-128N4 and 128P1-128P4) of NFET and PFET gate structures can be doped with different concentrations of REM-based dopants. The different concentrations of REM-based dopants can generate dipole layers (e.g., dipole layers 129N1-129N4 and 129P1-129P4) with varying dipole concentrations in the NFET and PFET gate structures. Tuning the dipole concentrations can tune the effective work function values of the NFET and PFET gate structures, and as a result, adjust the threshold voltages of the NFETs and PFETs. As such, NFETs and PFETs with different and/or low threshold voltages can be obtained without increasing the thickness of the WFM layers.

In some embodiments, a method includes forming nanostructured channel regions in a fin structure, depositing a high-K gate dielectric layer surrounding the nanostructured channel regions, selectively performing a first doping process with a rare-earth metal (REM)-based dopant on first and second portions of the high-K gate dielectric layer, and selectively performing a second doping process with the REM-based dopants on the first portions of the high-K gate dielectric layer and third portions of the high-K gate dielectric layer. The first doping process dopes the first and second portions of the high-K gate dielectric layer with a first REM-based dopant concentration. The second doping process dopes the first and third portions of the high-K gate dielectric layer with a second REM-based dopant concentration that is different from the first REM-based dopant concentration. The method further includes depositing a work function metal layer on the high-K gate dielectric layer and depositing a gate metal fill layer on the work function metal layer.

In some embodiments, a method includes forming first and second fin structures of n-type field effect transistors (NFETs) and p-type FETs (PFETs), respectively, forming first and second nanostructured channel regions in the first and second fin structures, respectively, depositing a high-K gate dielectric layer surrounding the first and second nanostructured channel regions, selectively forming a first rare-earth metal (REM)-based layer on first and second portions of the high-K gate dielectric layer on the first and second nanostructured channel regions, performing a first anneal process on the first REM-based layer, selectively forming a second REM-based layer on the first portions of the high-K gate dielectric layer and third portions of the high-K gate dielectric layer on the first and second nanostructured channel regions, performing a second anneal process on the second REM-based layer, depositing a work function metal layer on the high-K gate dielectric layer, and depositing a gate metal fill layer on the work function metal layer.

In some embodiments, a semiconductor device includes first, second, and third gate structures. The first gate structure includes a first interfacial oxide layer, a first high-K gate dielectric layer with a first rare-earth metal (REM) oxide dopant concentration disposed on the first interfacial oxide layer, and a first dipole layer with a first REM dipole concentration disposed at an interface between the first interfacial oxide layer and the first high-K gate dielectric layer. The second gate structure includes a second interfacial oxide layer, a second high-K gate dielectric layer with a second REM oxide dopant concentration disposed on the second interfacial oxide layer, and a second dipole layer with a second REM dipole concentration disposed at an interface between second first interfacial oxide layer and the first high-K gate dielectric layer. The third gate structure includes a third interfacial oxide layer, a third high-K gate dielectric layer with a third REM oxide dopant concentration disposed on the third interfacial oxide layer, and a third dipole layer with a third REM dipole concentration disposed at an interface between the third interfacial oxide layer and the first high-K gate dielectric layer. The first, second, and third REM oxide dopant concentrations are different from each other and the first, second, and third REM dipole concentrations are different from each other.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a nanostructured layer on a substrate;
   depositing a high-K gate dielectric layer surrounding the nanostructured layer;
   performing a first doping process with a first metal dopant concentration on first and second portions of the high-K gate dielectric layer;
   performing a second doping process with a second metal dopant concentration on the first portion of the high-K gate dielectric layer and a third portion of the high-K gate dielectric layer, wherein the second metal dopant concentration is different from the first metal dopant concentration;
   depositing a work function metal layer on the high-K gate dielectric layer; and
   depositing a gate metal fill layer on the work function metal layer.

2. The method of claim 1, wherein performing the first doping process comprises forming a rare-earth metal (REM)-based layer on the first and second portions of the high-K gate dielectric layer.

3. The method of claim 1, wherein performing the second doping process comprises forming a rare-earth metal (REM)-based layer on the first and third portions of the high-K gate dielectric layer.

4. The method of claim 1, wherein performing the first doping process comprises performing the first doping process at a temperature lower than a temperature of the second doping process.

5. The method of claim 1, wherein performing the first doping process comprises doping the first and second portions of the high-K gate dielectric layer with rare-earth metal (REM)-based dopants.

6. The method of claim 1, wherein performing the second doping process comprises doping the first and third portions of the high-K gate dielectric layer with rare-earth metal (REM)-based dopants.

7. The method of claim 1, wherein performing the first doping process comprises:
   depositing a rare-earth metal (REM)-based layer on the first and second portions of the high-K gate dielectric layer; and
   annealing the REM-based layer at a temperature of about 550° C. to about 850° C.

8. The method of claim 1, wherein performing the first doping process comprises:
   depositing a rare-earth metal (REM)-based layer on the first and second portions of the high-K gate dielectric layer;
   soak annealing the REM-based layer at a temperature of about 550° C. to about 800° C.; and
   spike annealing the REM-based layer at a temperature of about 700° C. to about 900° C.

9. The method of claim 1, wherein performing the first doping process comprises:

depositing a rare-earth metal (REM)-based layer on the first, second, and third portions of the high-K gate dielectric layer; and removing a portion of the REM-based layer to expose the third portion of the high-K gate dielectric layer.

10. The method of claim 1, wherein performing the second doping process comprises:

depositing a rare-earth metal (REM)-based layer on the first, second, and third portions of the high-K gate dielectric layer after the first doping process; and removing a portion of the REM-based layer to expose the second portion of the high-K gate dielectric layer prior to depositing the work function metal layer.

11. A method, comprising:

forming a first nanostructured layer of a first material on a substrate;

forming a second nanostructured layer of a second material on the substrate;

depositing a high-K gate dielectric layer surrounding the first and second nanostructured layers;

forming a first metal layer on first and second portions of the high-K gate dielectric layer;

performing a first anneal process on the first metal layer;

forming a second metal layer on the first portion of the high-K gate dielectric layer and third portion of the high-K gate dielectric layer;

performing a second anneal process on the second metal layer; and depositing a gate metal fill layer on the high-K gate dielectric layer.

12. The method of claim 11, wherein forming the first metal layer comprises forming the first metal layer with a thickness greater than a thickness of the second metal layer.

13. The method of claim 11, wherein forming the first metal layer comprises:

depositing a rare-earth metal (REM)-based layer on the first, second, and third portions of the high-K gate dielectric layer; and removing a portion of the REM-based layer to expose the third portion of the high-K gate dielectric layer prior to performing the first anneal process.

14. The method of claim 11, wherein forming the first metal layer comprises forming a layer of lanthanum oxide.

15. The method of claim 11, wherein forming the second metal layer comprises:

depositing a rare-earth metal (REM)-based layer on the first, second, and third portions of the high-K gate dielectric layer after the first anneal process; and removing a portion of the REM-based layer to expose the second portion of the high-K gate dielectric layer prior to performing the second anneal process.

16. The method of claim 11, wherein performing the first anneal process comprises performing the first anneal process at a temperature lower than a temperature of the second anneal process.

17. A semiconductor device, comprising:

a substrate;

a nanostructured layer disposed on the substrate;

a gate structure surrounding the nanostructured layer, wherein the gate structure comprises:

an oxide layer surrounding the nanostructured layer, and a high-k gate dielectric layer disposed on the oxide layer, wherein the high-k gate dielectric layer comprises metal-based dopants with a graded doping profile that decreases from a top surface of the high-k gate dielectric layer to a bottom surface of the high-k gate dielectric layer; and an epitaxial layer surrounding a portion of the nanostructured layer uncovered by the gate structure.

18. The semiconductor device of claim 17, further comprising a metal dipole layer disposed between the oxide layer and the high-k gate dielectric layer.

19. The semiconductor device of claim 17, wherein the high-k gate dielectric layer comprises rare-earth metal oxide dopants.

20. The semiconductor device of claim 17, wherein the high-k gate dielectric layer comprises a first concentration of rare-earth metal-based dopants and the oxide layer comprises a second concentration of the rare-earth metal-based dopants, and wherein the first concentration is greater than the second concentration.

* * * * *